US008134867B2

(12) United States Patent
Carman

(10) Patent No.: US 8,134,867 B2
(45) Date of Patent: Mar. 13, 2012

(54) MEMORY ARRAY HAVING A PROGRAMMABLE WORD LENGTH, AND METHOD OF OPERATING SAME

(75) Inventor: Eric Carman, Cernex (FR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/103,511

(22) Filed: May 9, 2011

(65) Prior Publication Data
US 2011/0273942 A1    Nov. 10, 2011

Related U.S. Application Data

(60) Continuation of application No. 12/371,551, filed on Feb. 13, 2009, now Pat. No. 7,940,559, which is a division of application No. 11/724,552, filed on Mar. 15, 2007, now Pat. No. 7,492,632.

(60) Provisional application No. 60/790,111, filed on Apr. 7, 2006.

(51) Int. Cl.
*G11C 11/34* (2006.01)

(52) U.S. Cl. .............. 365/177; 365/149; 365/230.06

(58) Field of Classification Search .......... 365/149, 365/174, 177, 195, 196, 189.011, 230.06
See application file for complete search history.

(56) References Cited

U.S. PATENT DOCUMENTS

| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |

(Continued)

FOREIGN PATENT DOCUMENTS

CA    272437    7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Gene Auduong
(74) *Attorney, Agent, or Firm* — Wilmer Cutler Pickering Hale and Dorr LLP

(57) ABSTRACT

A memory cell array and device having a memory cell array (i.e., an integrated circuit device, for example, a logic device (such as, a microcontroller or microprocessor) or a memory device (such as, a discrete memory)) including electrically floating body transistors in which electrical charge is stored in the body of the transistor, and techniques for reading, controlling and/or operating such memory cell array and such device. The memory cell array and device include a variable and/or programmable word length. The word length relates to the selected memory cells of a selected row of memory cells (which is determined via address data). In one embodiment, the word length may be any number of memory cells of a selected row which is less than or equal to the total number of memory cells of the selected row of the memory array. In one aspect, write and/or read operations may be performed with respect to selected memory cells of a selected row of the memory array, while unselected memory cells of the selected row are undisturbed.

20 Claims, 26 Drawing Sheets

U.S. PATENT DOCUMENTS

| | | | |
|---|---|---|---|
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |
| 5,313,432 A | 5/1994 | Lin et al. | |
| 5,315,541 A | 5/1994 | Harari et al. | |
| 5,350,938 A | 9/1994 | Matsukawa | |
| 5,355,330 A | 10/1994 | Hisamoto et al. | |
| 5,388,068 A | 2/1995 | Ghoshal et al. | |
| 5,397,726 A | 3/1995 | Bergemont et al. | |
| 5,432,730 A | 7/1995 | Shubat et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,506,436 A | 4/1996 | Hayashi et al. | |
| 5,515,383 A | 5/1996 | Katoozi | |
| 5,526,307 A | 6/1996 | Yiu et al. | |
| 5,528,062 A | 6/1996 | Hsieh et al. | |
| 5,568,356 A | 10/1996 | Schwartz | |
| 5,583,808 A | 12/1996 | Brahmbhatt | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,677,867 A | 10/1997 | Hazani | |
| 5,696,718 A | 12/1997 | Hartmann | |
| 5,740,099 A | 4/1998 | Tanigawa | |
| 5,754,469 A | 5/1998 | Hung et al. | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,798,968 A | 8/1998 | Lee et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 5,986,914 A | 11/1999 | McClure | |
| 6,018,172 A | 1/2000 | Hidada et al. | |
| 6,048,756 A | 4/2000 | Lee et al. | |
| 6,081,443 A | 6/2000 | Morishita | |
| 6,096,598 A | 8/2000 | Furukawa et al. | |
| 6,097,056 A | 8/2000 | Hsu et al. | |
| 6,097,624 A | 8/2000 | Chung et al. | |
| 6,111,778 A | 8/2000 | MacDonald et al. | |
| 6,121,077 A | 9/2000 | Hu et al. | |
| 6,133,597 A | 10/2000 | Li et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,698 B1 | 1/2001 | Gruening et al. | |
| 6,177,708 B1 | 1/2001 | Kuang et al. | |
| 6,214,694 B1 | 4/2001 | Leobandung et al. | |
| 6,222,217 B1 | 4/2001 | Kunikiyo | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,262,935 B1 | 7/2001 | Parris et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,333,866 B1 | 12/2001 | Ogata | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,432,769 B1 | 8/2002 | Fukuda et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,480,407 B1 | 11/2002 | Keeth | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,537,871 B2 | 3/2003 | Forbes | |
| 6,538,916 B2 | 3/2003 | Ohsawa | |
| 6,544,837 B1 | 4/2003 | Divakauni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,552,932 B2 | 4/2003 | Cernea | |
| 6,556,477 B2 | 4/2003 | Hsu et al. | |
| 6,560,142 B1 | 5/2003 | Ando | |
| 6,563,733 B2 | 5/2003 | Liu et al. | |
| 6,566,177 B1 | 5/2003 | Radens et al. | |
| 6,567,330 B2 | 5/2003 | Fujita et al. | |
| 6,573,566 B2 | 6/2003 | Ker et al. | |
| 6,574,135 B1 | 6/2003 | Komatsuzaki | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,653,175 B1 | 11/2003 | Nemati et al. | |
| 6,686,624 B2 | 2/2004 | Hsu | |
| 6,703,673 B2 | 3/2004 | Houston | |
| 6,707,118 B2 | 3/2004 | Muljono et al. | |
| 6,714,436 B1 | 3/2004 | Burnett et al. | |
| 6,721,222 B2 | 4/2004 | Somasekhar et al. | |
| 6,754,108 B2 * | 6/2004 | Forbes | 365/185.25 |
| 6,818,491 B2 * | 11/2004 | Lee et al. | 438/200 |
| 6,825,524 B1 | 11/2004 | Ikehashi et al. | |
| 6,861,689 B2 | 3/2005 | Burnett | |
| 6,870,225 B2 | 3/2005 | Bryant et al. | |
| 6,882,566 B2 | 4/2005 | Nejad et al. | |
| 6,888,770 B2 | 5/2005 | Ikehashi | |
| 6,894,913 B2 | 5/2005 | Yamauchi | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portman et al. | |
| 6,913,964 B2 | 7/2005 | Hsu | |
| 6,936,508 B2 | 8/2005 | Visokay et al. | |
| 6,969,662 B2 | 11/2005 | Fazan et al. | |
| 6,975,536 B2 | 12/2005 | Maayan et al. | |
| 6,982,902 B2 | 1/2006 | Gogl et al. | |
| 6,987,041 B2 | 1/2006 | Ohkawa | |
| 7,030,436 B2 | 4/2006 | Forbes | |
| 7,037,790 B2 | 5/2006 | Chang et al. | |
| 7,041,538 B2 | 5/2006 | Ieong et al. | |
| 7,042,765 B2 | 5/2006 | Sibigtroth et al. | |
| 7,061,806 B2 | 6/2006 | Tang et al. | |
| 7,085,153 B2 | 8/2006 | Ferrant et al. | |
| 7,085,156 B2 * | 8/2006 | Ferrant et al. | 365/174 |
| 7,170,807 B2 | 1/2007 | Fazan et al. | |

| | | |
|---|---|---|
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 * | 11/2007 | Okhonin et al. ............... 365/177 |
| 7,301,838 B2 * | 11/2007 | Waller et al. .................. 365/205 |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,476,939 B2 * | 1/2009 | Okhonin et al. ............... 257/347 |
| 7,477,540 B2 | 1/2009 | Okhonin et al. |
| 7,492,632 B2 * | 2/2009 | Carman ........................ 365/177 |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 7,924,630 B2 * | 4/2011 | Carman .................... 365/189.04 |
| 7,940,559 B2 * | 5/2011 | Carman ........................ 365/177 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |

| EP | 0 727 822 | 8/1999 |
| --- | --- | --- |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | 62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | S08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Arimoto, A High—Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage Mosfet (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm Box, Oct. 2008, SOI Conference.
Bae, Evaluation of 1T RAM using Various Operation Methods with SOONO (Silicon-On-ONO) device, Dec. 2008, IEDM.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Ban, a Scaled Floating Body Cell (FBC) Memory with High-k+Metal Gate on Thin—Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06, International, IEEE, Dec. 11-13, 2006.
Bawedin, Maryline, et al., a Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J. Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, a novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar—MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDl.
Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., a Highly Scalable Capacitorless Double Gate Quantum Well Single Transistor Dram: 1T-QW DRAM, 2008, IEEE EDI.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDI.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid—State Circuits, vol. 24, No. 2, Apr. 1989, pp. 388-393.

Giffard et al., " Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified—RAM (URAM) Cell for Multifunctioning NVM and Capacitorless 1T—DRAM, 2008, IEEE EDI.

Han et al., Partially Depleted Sonos FinFET for Unified RAM (URAM) Unified Function for High—Speed 1T DRAM and Nonvolatile Memory, 2008, IEEE EDI.

Han, Energy Band Engineered Unified—RAM (URAM) for Multi—Functioning 1T—DRAM and NVM, Dec. 2008, IEDM.

Han, Parasitic BJT Read Method for High-Performance Capacitorless 1T-DRAM Mode in Unified RAM, Oct. 2009, IEEE EDI.

Hara, Y., 'Toshiba's DRAM Cell Piggybacks on SOI Wafer', EE Times, Jun. 2003.

Hu, C., 'SOI (Silicon-on-Insulator) for High Speed Ultra Large Scale Integration', Jpn. J. Appl. Phys. vol. 33 (1994) pp. 365-369, Part 1, No. 1B, Jan. 1994.

Idei et al., "Soft- Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation—Recombination Processes of Gate and STI Oxide Interfaces Responsible for Junction Leakage on SOI, Sep. 2009, ECS Transactions, vol. 25.

Liu, Surface Recombination—Generation Processes of Gate, STI and Buried Oxide Interfaces, Responsible for Junction Leakage, ICSI, May 19, 2009.

Loncar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a ITBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, a Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z—RAMO Devices, Oct. 2009, SOI conference.

Morishita, a Capacitorless Twin- Transistor Random Access Memory (TTRAM) on SOI, 2005, CICC.

Morishita, F. et al., "A Configurable Enhanced TTRAM Macro for System-Level Power Management Unified Memory", IEEE Journal of Solid —State Circuits, vol. 42, No. 4, pp. 853, Apr. 2007.

Morishita, F., et al., "A 312—MHz 16-Mb Random-Cycle Embedded DRAM Macro With a Power-Down Data Retention Mode for Mobile Applications", J. Solid—State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying Of Hot Carrier Effect In Floating Body Soi Mosfets By The Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.5621 μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., 'Suppression of Parasitic Bipolar Action in Ultra-Thin-Film Fully-Depleted CMOS/SIMOX Devices by Ar-Ion Implantation into Source/Drain Regions', IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, a 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-MB SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitoless DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted Soi device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., " A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source- Bias Dependent Charge Accumulation in P+ —Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns. 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80—C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick-and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pgs. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot—Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

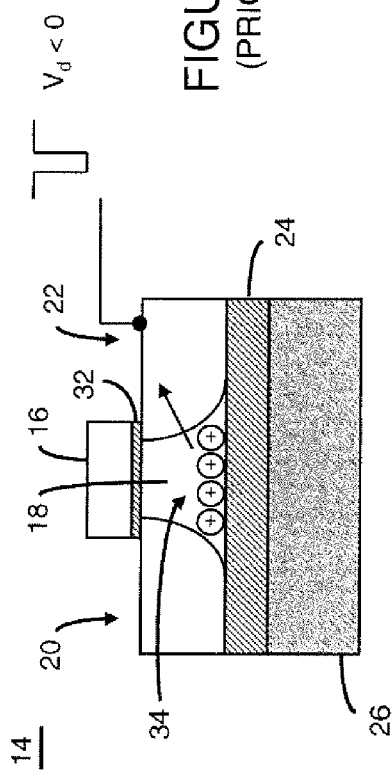
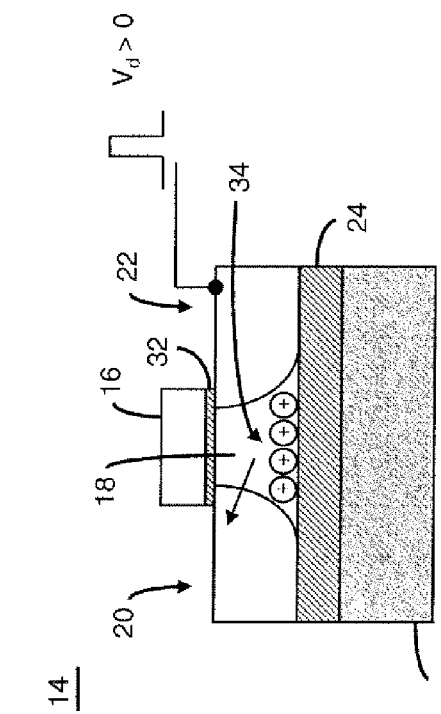
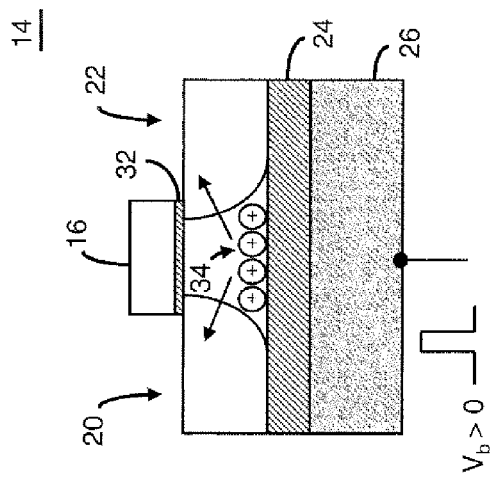
FIGURE 4A (PRIOR ART)
FIGURE 4B (PRIOR ART)
FIGURE 4C (PRIOR ART)

MEMORY ARRAY HAVING A PROGRAMMABLE WORD LENGTH, AND METHOD OF OPERATING SAME

RELATED APPLICATIONS

This application is a continuation application of U.S. patent application Ser. No. 12/371,551 filed Feb. 13, 2009, entitled "Memory Array having a Programmable Word Length, and Method of Operating Same" which is a divisional application of U.S. patent application Ser. No. 11/724,552, filed Mar. 15, 2007, entitled "Memory Array having a Programmable Word Length, and Method of Operating Same" (now U.S. Pat. No. 7,492,632). This application, the '551 application, and the '552 application, claim priority to U.S. Provisional Patent Application Ser. No. 60/790,111, filed Apr. 7, 2006, entitled "Memory Array having a Programmable Word Length, and Technique of Implementing Same". The contents of these related applications are incorporated by reference herein in their entirety.

BACKGROUND

The present inventions relate to a memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes a transistor having an electrically floating body in which an electrical charge is stored.

There is a continuing trend to employ and/or fabricate advanced integrated circuits using techniques, materials and devices that improve performance, reduce leakage current and enhance overall scaling. Semiconductor-on-insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) having a channel, which is interposed between the body and the gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors, (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carriers may be removed via drain side hole removal (see, FIG. 4A), source side hole removal (see, FIG. 46), or drain and source hole removal, for example, using the back gate pulsing (see, FIG. 4C).

Further, FIG. 5 illustrates the conventional reading technique. In one embodiment, the state of the memory cell may be determined by sensing the amount of the channel current provided/generated in response to the application of a predetermined voltage on the gate of the transistor of the memory cell.

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in U.S. Non-Provisional patent application Ser. No. 11/509,188, filed on Aug. 24, 2006, and entitled "Memory Cell and Memory Cell Array Having an Electrically Floating Body Transistor, and Methods of Operating Same" (hereinafter "the '188 application"), which is incorporated by reference herein. In one aspect, the '188 application is directed to programming, reading and/or control methods which allow low power memory programming and provide larger memory programming window (both relative to at least the conventional programming techniques).

With reference to FIG. 6, in one embodiment, the '188 application employs memory cell 12 having electrically floating body transistor 14. The electrically floating body transistor 14, in addition to the MOS transistor, includes an intrinsic bipolar transistor (including, under certain circumstances, a significant intrinsic bipolar current). In this illustrative exemplary embodiment, electrically floating body transistor 14 is an N-channel device. As such, majority carriers are "holes".

With reference to FIG. 7, in one embodiment, the '188 application employs, writes or programs a logic "1" or logic high using control signals (having predetermined voltages, for example, Vg=0v, Vs=0v, and Vd=3v) which are applied to gate 16, source region 20 and drain region 22 (respectively) of transistor 14 of memory cell 12. Such control signals induce or cause impact ionization and/or the avalanche multiplication phenomenon. (See, FIG. 7). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 8, when writing or programming logic "0" in transistor 14 of memory cell 12, in one embodiment of the '188 application, the control signals (having predetermined voltages (for example, Vg=1.5v, Vs=0v and Vd=0v) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 8). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 32 and electrically floating body region 18. (See, FIG. 9). In this embodiment, it may be preferable to apply a negative voltage to gate 16 where transistor 14 is an N-channel type transistor.

With reference to FIG. 10, in one embodiment of the '188 application, the data state of memory cell 12 may be read and/or determined by applying control signals (having predetermined voltages, for example, Vg=−0.5v, Vs=3v and Vd=0v) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 application, which, as noted above, is incorporated by reference).

As mentioned above, the reading may be performed using positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel transistors) to accumulate in or near the interface between gate 16 and body region 18 of transistor 14.

With continued reference to FIGS. 11 and 12, in this exemplary embodiment of the '188 application, control signals having predetermined amplitudes may be applied to memory cells 12b and 12c to write or program logic state "0" therein. In this exemplary embodiment, the source pulse may be applied to source region 20 of memory cells 12b and 12c before the gate pulse is applied to gate 16 of memory cells 12b and 12c, or simultaneously thereto, or after the gate pulse is applied to gate 16 of memory cells 12b and 12c. In this exemplary embodiment, a drain pulse (0.5V amplitude in this example) is applied to drain regions 22 of memory cells 12b and 12d to prevent, prohibit, limit and/or retard a bipolar current (if any) from causing or generating a sufficient charge in the floating body region of memory cells 12b and 12c to program or write a logic state "1" into memory cells 12b and 12c. The drain pulse prevents bipolar current and the write of a logic state "1" but is not high enough to block the ejection of majority charges from the floating body region, thus a logic state "0" is written.

From a relative timing perspective, it is preferred that the drain pulse be applied to drain region 22 of memory cells 12b and 12c for a temporal period that extends or is applied before, during and after the source and gate pulses (for example, initiates, starts, ramps, declines and/or terminates) as illustrated in FIG. 11.

Notably, with continued reference to FIGS. 11 and 12, for those unselected memory cells (i.e., the memory cells coupled to word lines $28_{i+1}$, $28_{i+2}$ and $28_{i+3}$), a holding condition may be applied or established to prevent, minimize or avoid disturbance of the data state of, or charge stored in the unselected memory cells. In this regard, a voltage (for example, −1.2V) may be applied to gates 16 of the unselected memory cells and a voltage (for example, 0V) may be applied to source regions 20 and drain regions 22 of the unselected memory cells to prevent, minimize or avoid disturbance of the data state in the unselected memory cells during the programming or writing operation. Under these conditions, the data state of the unselected memory cells is unaffected (or substantially unaffected) by the programming of or writing to selected memory cells 12a-d.

With reference to FIGS. 11 and 13, in an exemplary embodiment described and illustrated in the '188 application, control signals having a predetermined amplitude may be selectively applied to a row of memory cells (for example, memory cells 12a-d) to read the data state in each of the selected memory cells 12a-12d. In this exemplary embodiment, a voltage pulse of 3V may be applied to source region 20, and a voltage pulse of −0.5V may be applied to gate 16 of memory cells 12a-d. In this embodiment, the source pulse may be applied to source region 20 before application of the gate pulse to gate 16, simultaneously thereto, or after the gate pulse is applied to gate 16. Further, the source pulse may cease or terminate before the gate pulse, simultaneously thereto (as illustrated in FIG. 11), or after the gate pulse concludes or ceases.

Notably, for those memory cells that are not read (i.e., those memory cells coupled to word lines $28_{i+1}$, $28_{i+2}$ and $28_{i+3}$), a holding condition may be applied or established to prevent, minimize or avoid disturbance of the data state in the unselected memory cells. In this regard, a voltage (for example, −1.2V) may be applied to gates 16 of the unselected memory cells and a voltage (for example, 0V) may be applied to source regions 20 of the unselected memory cells to prevent, minimize or avoid disturbance of the data state in the unselected memory cells during the read operation. Under these conditions, the state of the unselected memory cells is unaffected (or it is substantially unaffected) during the reading of selected memory cells 12a-d.

The illustrated/exemplary voltage levels to implement the write and read operations, with respect to the '188 application are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device (for example, a logic or discrete memory device) comprising a memory cell array having a plurality of word lines, a plurality of source lines, a plurality of bit lines, and a plurality of memory cells arranged in a matrix of rows and columns, wherein each memory cell includes an electrically floating body transistor. The electrically floating body transistor (for example, an N-channel type transistor or a P-channel type transistor) includes a first region coupled to an associated source line, a second region coupled to an associated bit line, a body region disposed between the first region and the second region, wherein the body region is electrically floating, and a gate coupled to an associated word line. The memory cell includes a plurality of data states which are representative of a charge in the body region of the electrically floating body transistor.

The integrated circuit device of this aspect further includes write circuitry, coupled to each memory cell of a first row of memory cells, to apply (I) write control signals to a first group of memory cells of the first row of memory cells to write one of the plurality of data states therein, and (ii) write de-select control signals to a second group of memory cells of the first row of memory cells to inhibit writing of write one of the plurality of data states therein.

In one embodiment, the write circuitry applies write de-select control signals to each memory cell of the second group of memory cells before or concurrently with applying at least one of the write control signals to the first group of memory cells of the first row of memory cells.

The number of memory cells of the first group of memory cells may correspond to a word length of the memory cell array. In one embodiment, the integrated circuit device includes word length selection circuitry (for example, fuses or anti-fuses, or DRAM, SRAM, ROM, PROM, EPROM, EEPROM cells, latches, registers, and/or fixed via, for example, voltages applied to signal lines or pins) to store data which is representative of the word length.

In one embodiment, the write de-select control signals include: (i) a first temporally changing signal applied to the gate of each memory cell of the second group of memory cells, (ii) a second temporally changing signal applied to the first region of each memory cell of the second group of memory cells, and (iii) a third temporally changing signal applied to the second region of each memory cell of the second group of memory cells. In this embodiment, the write control signals may include: (i) the first temporally changing signal applied to the gate of each memory cell of the first group of memory cells, (ii) the second temporally changing signal applied to the first region of each memory cell of the first group of memory cells, and (iii) a fourth temporally changing signal applied to the second region of each memory cell of the first group of memory cells.

In another embodiment, the write de-select control signals include: (i) a first temporally changing signal applied to the gate of each memory cell of the second group of memory cells, (ii) a second temporally changing signal applied to the first region of each memory cell of the second group of memory cells, and (iii) a third signal having a substantially constant voltage amplitude applied to the second region of each memory cell of the second group of memory cells. In this embodiment, the write control signals may include: (i) the first temporally changing signal applied to the gate of each memory cell of the first group of memory cells, (ii) the second temporally changing signal applied to the first region of each memory cell of the first group of memory cells, and (iii) a fourth temporally changing signal applied to the second region of each memory cell of the first group of memory cells.

The integrated circuit device may further include read circuitry, coupled to each memory cell of the first row of memory cells, to apply: (i) read control signals to the first group of memory cells of the first row of memory cells to read the data state of each memory cell of the first group of memory cells, and (ii) read de-select control signals to the second group of memory cells of the first row of memory cells to inhibit reading the data state of each memory cell of the second group of memory cells.

The read control signals may include a signal applied to the gate, a signal applied to the first region, and a signal applied to the second region of the electrically floating body transistor of each memory cell of the first group of memory cells to cause, force and/or induce a read bipolar transistor current which is representative of the data state of each memory cell of the first group of memory cells of the first row of memory cells.

In one embodiment, the read circuitry determines the data state of the memory cell substantially based on the read bipolar transistor current. Indeed, the read circuitry may include a plurality of sense amplifiers.

In another embodiment, the write control signals include control signals to write the first data state and wherein, in response to the control signals to write the first data state into a predetermined memory cell of the first row of memory cells, the electrically floating body transistor of the predetermined memory cell of the first row of memory cells generates a bipolar transistor current which substantially provides the first charge in the body region of the electrically floating body transistor of the predetermined memory cell of the first row of memory cells.

In one embodiment, the memory cells may store more than one data bit (for example, two, three, four, five, six, etc.) and/or more than two data states (for example, three, four, five, six, etc. data or logic states). As such, each memory cell of the memory cell array may include a third data state which is representative of a third charge in the body region of the electrically floating body transistor.

In another principle aspect, the present inventions are directed to an integrated circuit device (for example, a logic or discrete memory device) comprising a memory cell array having a plurality of word lines, a plurality of source lines, a plurality of bit lines, and a plurality of memory cells arranged in a matrix of rows and columns, wherein each memory cell includes an electrically floating body transistor. The electrically floating body transistor (for example, an N-channel type transistor or a P-channel type transistor) includes a first region coupled to an associated source line, a second region coupled to an associated bit line, a body region disposed between the first region and the second region, wherein the body region is electrically floating, and a gate coupled to an associated word line. The memory cell includes a plurality of data states which are representative of a charge in the body region of the electrically floating body transistor.

The integrated circuit device of this aspect further includes circuitry (for example, a plurality of sense amplifiers), coupled to each memory cell of the first row of memory cells, to substantially apply: (i) read control signals to a first group of memory cells of the first row of memory cells to read the data state of each memory cell of the first group of memory cells, and (H) read de-select control signals to a second group of memory cells of the first row of memory cells to inhibit reading the data state of each memory cell of the second group of memory cells.

In one embodiment, the read circuitry applies read de-select control signals to each memory cell of the second group of memory cells before or concurrently with applying at least one of the read control signals to the first group of memory cells of the first row of memory cells.

In one embodiment, the read control signals include a signal applied to the gate, a signal applied to the first region, and a signal applied to the second region of the electrically floating body transistor of each memory cell of the first group of memory cells to cause, force and/or induce a read bipolar transistor current which is representative of the data state of each memory cell of the first group of memory cells of the first row of memory cells. In this embodiment, the circuitry may determine the data state of the memory cell substantially based on the read bipolar transistor current.

In one embodiment, the integrated circuit device may further include write circuitry, coupled to each memory cell of a first row of memory cells, to concurrently apply: (i) write control signals to a first group of memory cells of the first row of memory cells to write one of the plurality of data states therein, and (ii) write de-select control signals to a second group of memory cells of the first row of memory cells to inhibit the writing of write one of the plurality of data states therein. The write control signals include control signals to write the first data state and wherein, in response to the control signals to write the first data state into a predetermined memory cell of the first row of memory cells, the electrically floating body transistor of the predetermined memory cell of the first row of memory cells generates a bipolar transistor current which substantially provides the first charge in the body region of the electrically floating body transistor of the predetermined memory cell of the first row of memory cells.

The number of memory cells of the first group of memory cells may correspond to a word length of the memory cell array. In one embodiment, the integrated circuit device includes word length selection circuitry (for example, fuses or anti-fuses, or DRAM, SRAM, ROM, PROM, EPROM, EEPROM cells, latches, registers, and/or fixed via, for example, voltages applied to signal lines or pins) to store data which is representative of the word length.

In yet another principle aspect, the present inventions are directed to an integrated circuit device (for example, a logic or discrete memory device) comprising a semiconductor memory array, disposed in or on a semiconductor region or layer which resides on or above an insulating region or layer of a substrate. The semiconductor memory array includes a plurality of word lines, a plurality of source lines, a plurality of bit lines, and a plurality of memory cells arranged in a matrix of rows and columns, wherein each memory cell includes a transistor. The transistor (for example, an N-channel type transistor or a P-channel type transistor) includes a first region coupled to an associated source line, a second region coupled to an associated bit line, a body region disposed between the first region and the second region, wherein the body region is electrically floating, and a gate coupled to an associated word line.

The integrated circuit device of this aspect also includes write circuitry, coupled to each memory cell of a first row of memory cells, to apply (i) write control signals to a first group of memory cells of the first row of memory cells to write one of the plurality of data states therein, and (ii) write de-select control signals to a second group of memory cells of the first row of memory cells to inhibit writing of write one of the plurality of data states therein. The write circuitry in this aspect of the invention applies write de-select control signals to each memory cell of the second group of memory cells before or concurrently with applying at least one of the write control signals to a first group of memory cells of the first row of memory cells The integrated circuit device of this aspect may further includes read circuitry (for example, a plurality of sense amplifiers), coupled to each memory cell of the first row of memory cells, to substantially apply: (i) read control signals to a first group of memory cells of the first row of memory cells to read the data state of each memory cell of the first group of memory cells, and (ii) read de-select control signals to a second group of memory cells of the first row of memory cells to inhibit reading the data state of each memory cell of the second group of memory cells.

In one embodiment, the read control signals include a signal applied to the gate, a signal applied to the first region, and a signal applied to the second region of the electrically floating body transistor of each memory cell of the first group of memory cells to cause, force and/or induce a read bipolar transistor current which is representative of the data state of each memory cell of the first group of memory cells of the first row of memory cells. In this embodiment, the read circuitry determines the data state of the memory cell substantially based on the read bipolar transistor current.

In one embodiment, the write control signals include control signals to write the first data state and wherein, in response to the control signals to write the first data state into a predetermined memory cell of the first row of memory cells, the electrically floating body transistor of the predetermined memory cell of the first row of memory cells generates a bipolar transistor current which substantially provides the first charge in the body region of the electrically floating body transistor of the predetermined memory cell of the first row of memory cells.

The number of memory cells of the first group of memory cells may correspond to a word length of the memory cell array. In one embodiment, the integrated circuit device includes word length selection circuitry (for example, fuses or anti-fuses, or DRAM, SRAM, ROM, PROM, EPROM, EEPROM cells, latches, registers, and/or fixed via, for example, voltages applied to signal lines or pins) to store data which is representative of the word length.

As noted above, the memory cells may store more than one data bit (for example, two, three, four, five, six, etc.) and/or more than two data states (for example, three, four, five, six, etc. data or logic states). As such, each memory cell of the memory cell array may include a third data state which is representative of a third charge in the body region of the electrically floating body transistor.

Again, there are many inventions, and aspects of the inventions, described and illustrated herein. This Summary is not exhaustive of the scope of the present inventions. Indeed, this Summary may not be reflective of or correlate to the inventions protected by the claims in this and/or in continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 4A-4C are exemplary schematics and general illustrations of conventional methods to program a memory cell to logic state "0" (i.e., provide relatively fewer majority carriers by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor by using, for example, the back gate pulses applied to the substrate/backside terminal of the transistor of the memory cell (FIG. 4C));

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In one aspect, the present inventions are directed to techniques for reading, controlling and/or operating a semiconductor memory cell, array, architecture and device (i.e., an integrated circuit device, for example, a logic device (such as, a microcontroller or microprocessor) or a memory device (such as, a discrete memory)) including electrically floating body transistors in which electrical charge is stored in the body of the transistor. The present inventions are also directed to semiconductor memory cell, array, architecture and device that include circuitry to implement such reading, controlling and/or operating techniques.

In one embodiment, the word length (which relates to the selected memory cells of a given/predetermined selected row of memory cells) of the memory cell array is variable and/or programmable. The word length may be an amount equal to any number of memory cells of a selected row which is less than or equal to the total number of memory cells of the selected row of the memory array. In one aspect of the inventions, write and/or read operations may be performed with respect to selected memory cells (i.e., a first group of memory cells) of a selected row of the memory array, while unselected memory cells (i.e., a second group of memory cells) of the selected row are undisturbed.

Although not limited thereto, in certain aspects the present inventions will be described in the context of an embodiment of the '188 application wherein the word length of the memory array is variable and/or programmable.

Figure 15:
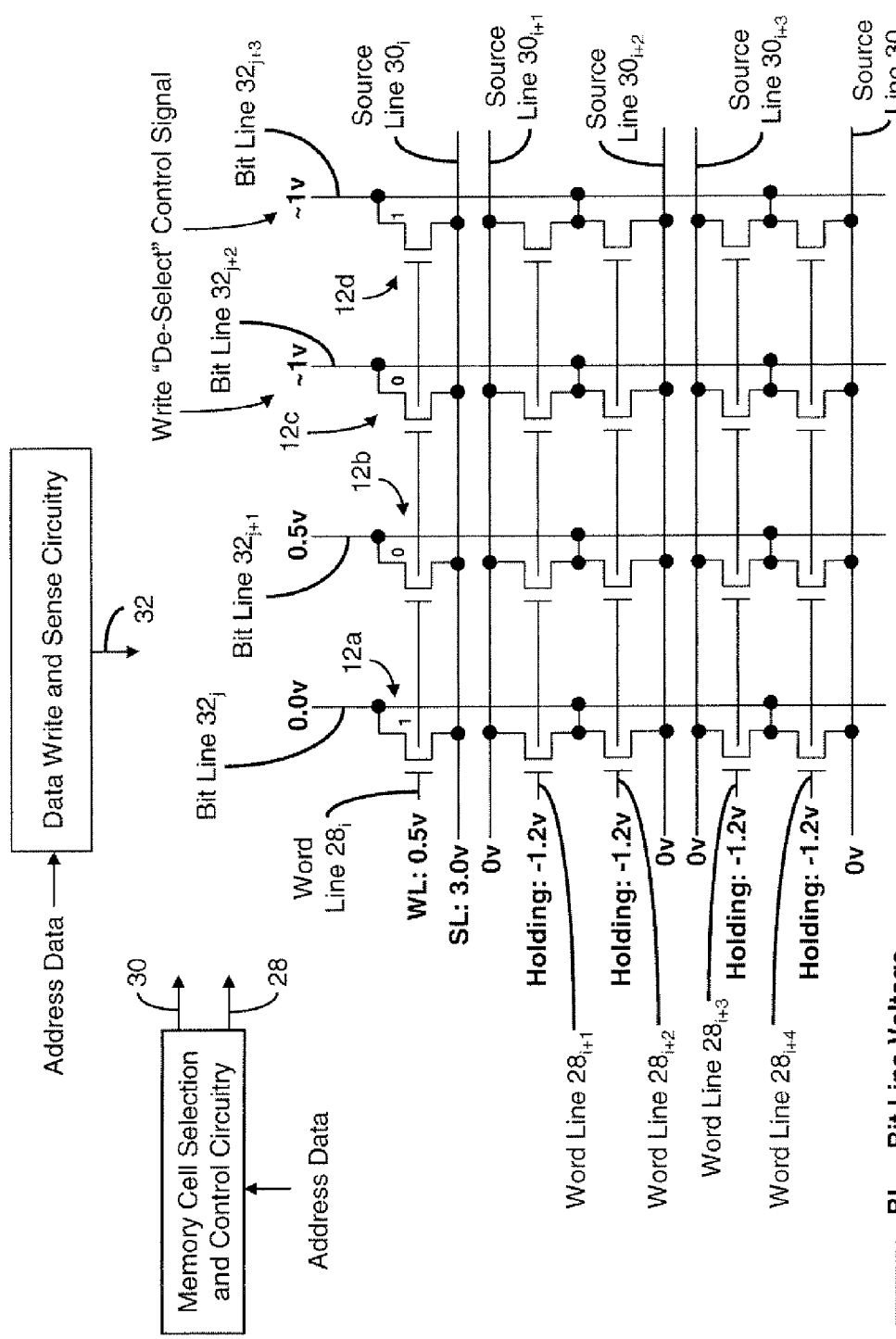
FIG. 15 illustrates an exemplary embodiment of a memory array employing a common source line configuration for each row of memory cells in conjunction with control signal voltages to write/program selected memory cells of a selected row of memory cells and control voltages to de-select or "block" the write/program operation of unselected memory cells of the selected row of memory cells, in accordance with certain aspect of the present inventions.
Figure 16:
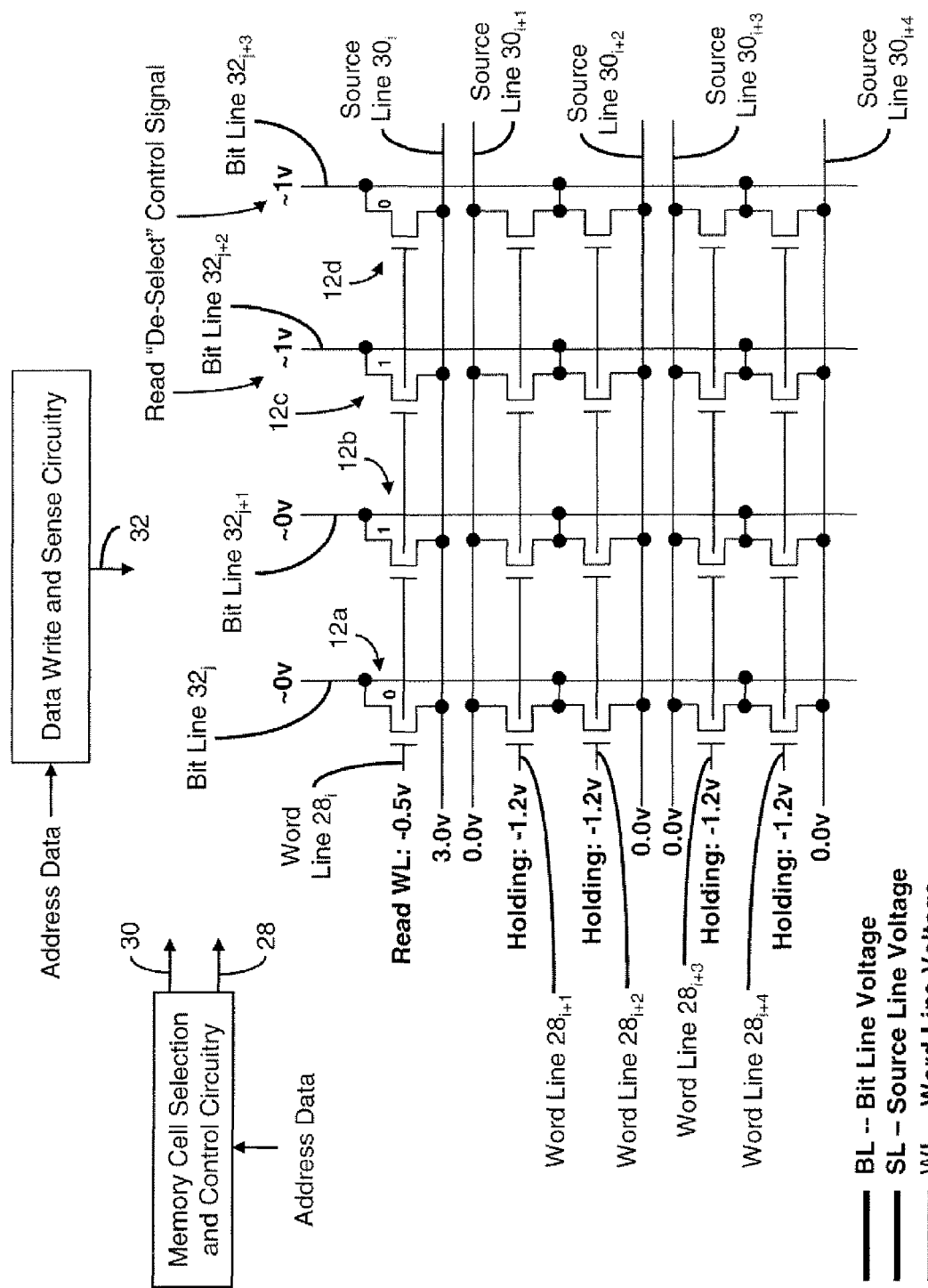
FIG. 16 illustrates an exemplary embodiment of a memory array employing a common source line configuration for each row of memory cells in conjunction with control signal voltages to read the data state of selected memory cells of a selected row of memory cells and control voltages to de-select or "block" the read operation of unselected memory cells of the selected row of memory cells, in accordance with certain aspect of the present inventions.
Figure 17:
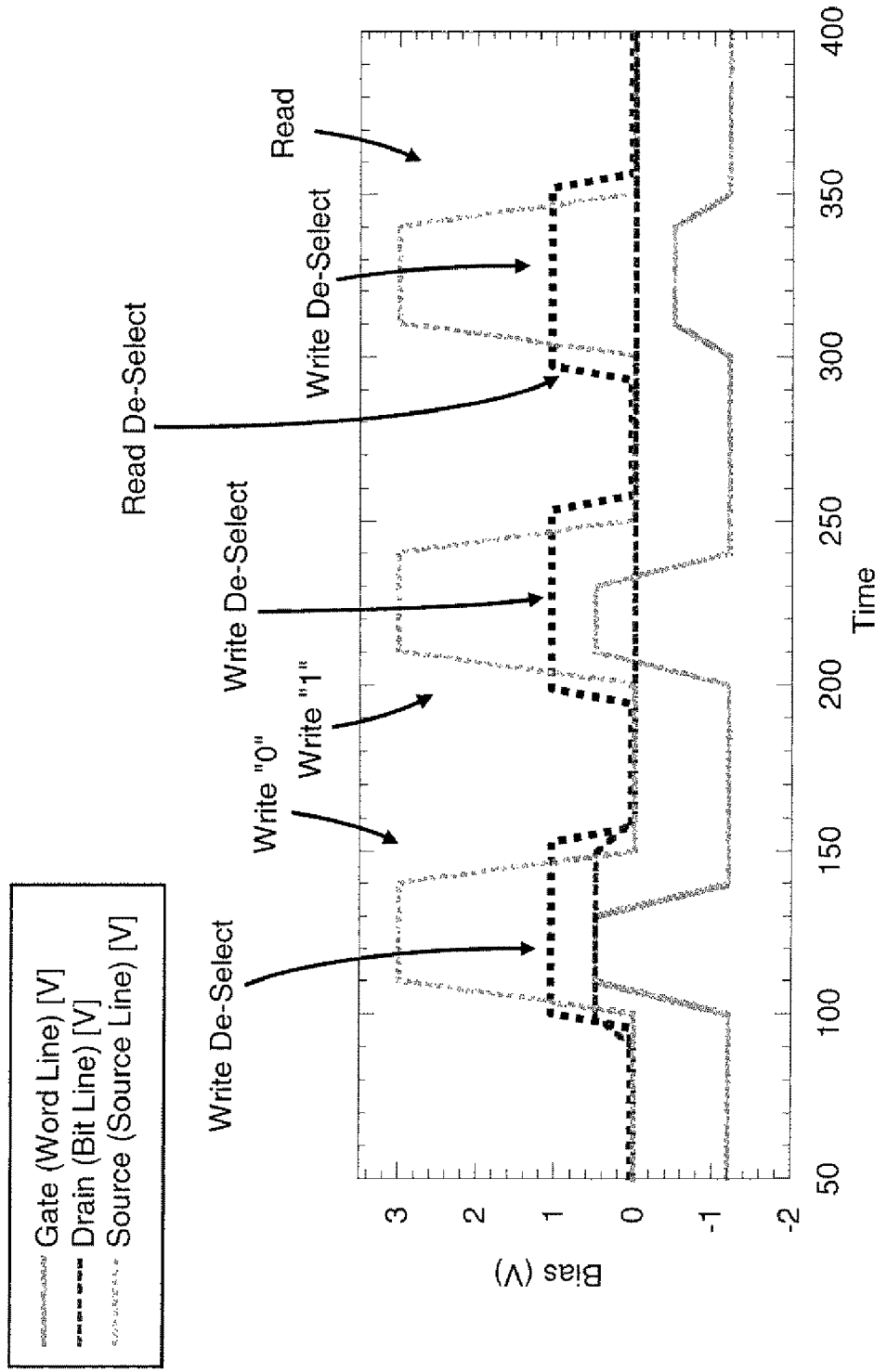
FIGS. 17, 18, and 19 illustrate exemplary timing relationships of selected write control signals to (i) de-select, program or write of logic state "1" into one or more N-channel type memory cells, (ii) de-select, program or write of logic state "0" into one or more N-channel type memory cells, and (iii) de-select or read of one or more N-channel type memory cells, in accordance with certain aspect of the present inventions, wherein the de-select control signal includes a pulsed characteristic (see, FIG. 17) and a non-pulsed characteristic (see, FIGS. 18 and 19)
Figure 18:
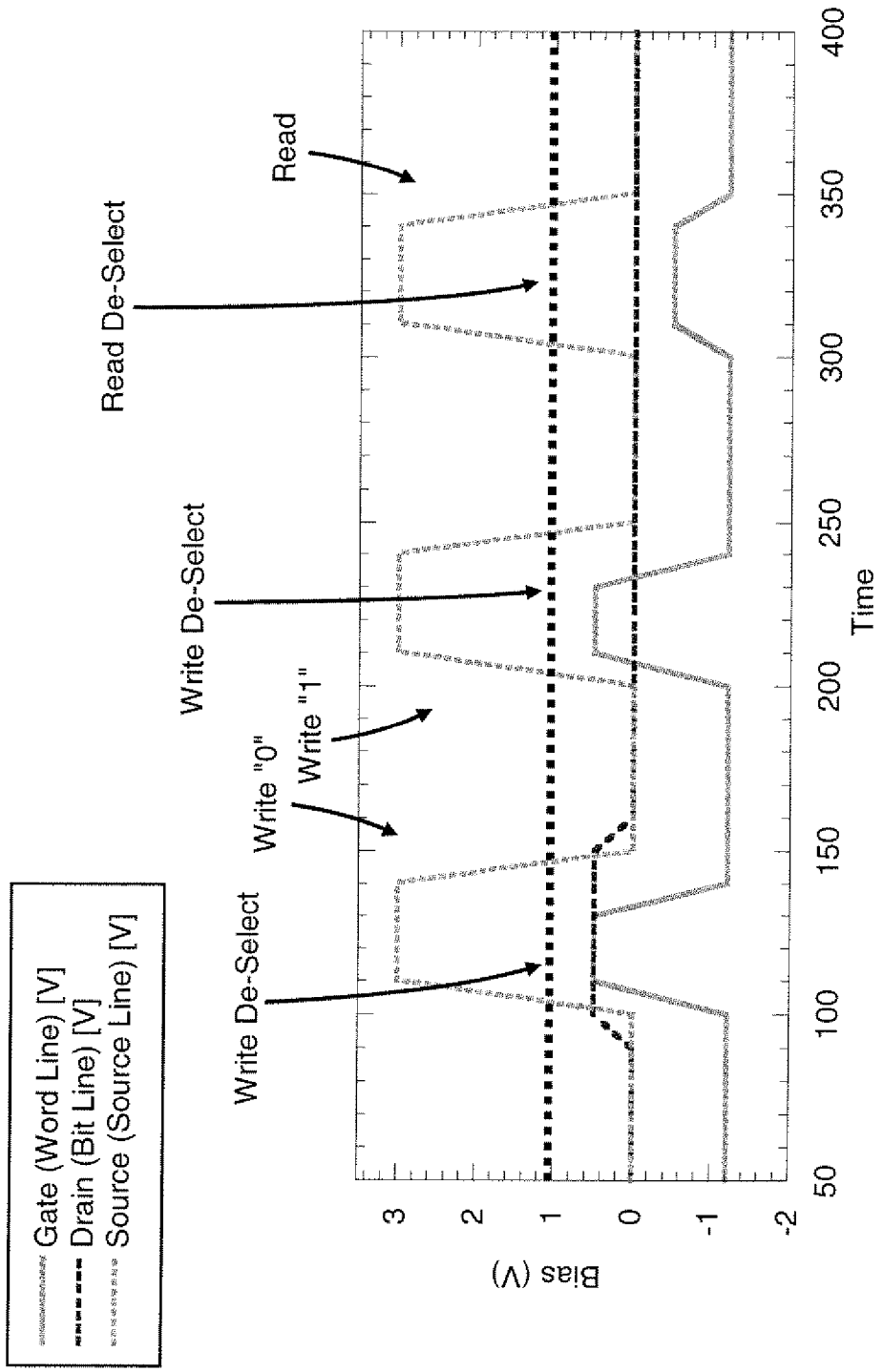
Figure 19:
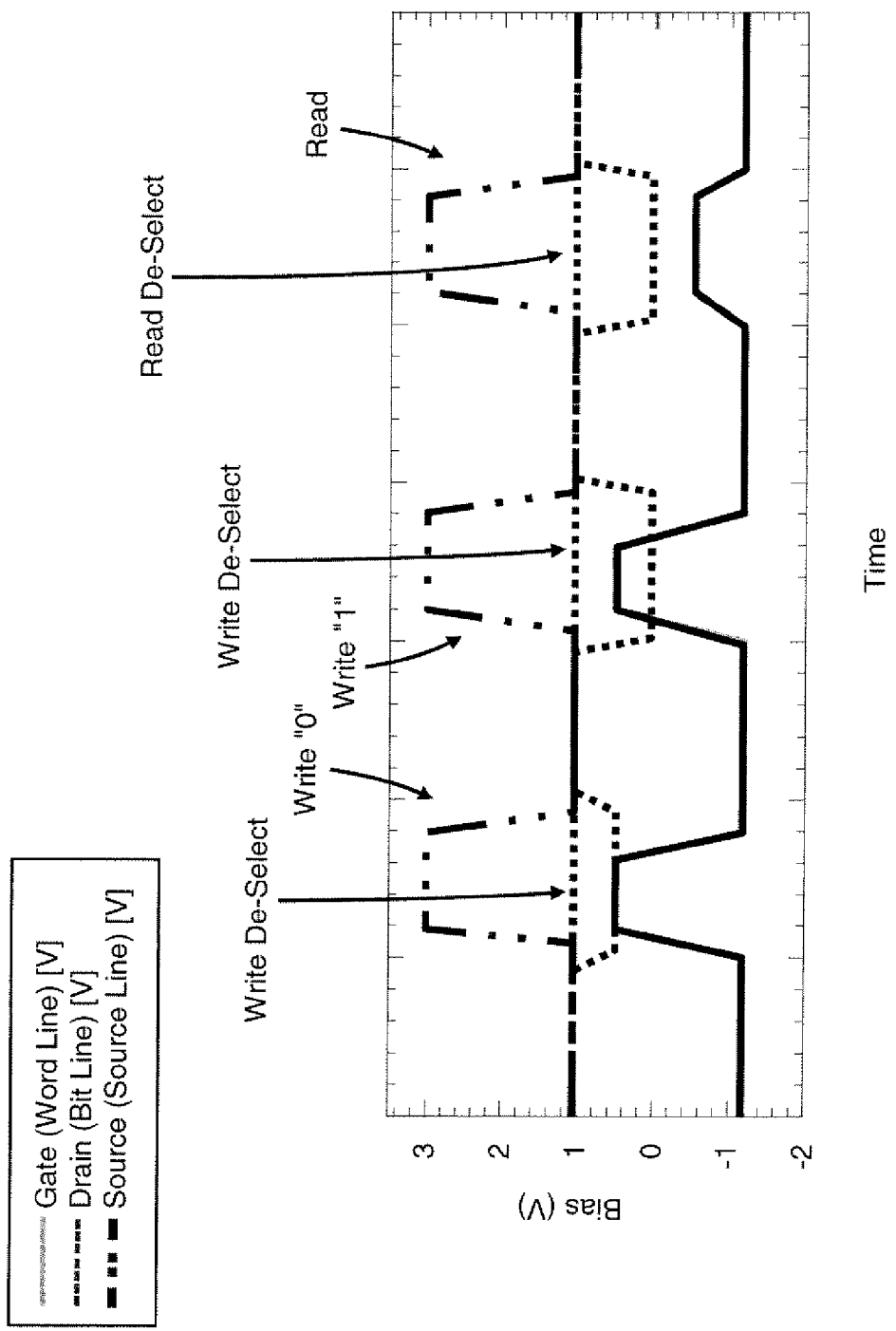

With reference to FIGS. 15, 17, and 18 in an exemplary embodiment, exemplary control signals having predetermined amplitude may be selectively applied (based on address data) to a given/predetermined row of memory cells (for example, memory cells 12a-d which are connected to the same word line, namely word line $28_i$) to write logic state "1" into selected memory cell 12a, and logic state "0" into selected memory cell 12b. Concurrently or substantially concurrently (hereinafter collectively, "concurrently") therewith, exemplary "write de-select" control signals, having predetermined amplitude, are applied to unselected memory cells 12c and 12d to prevent, inhibit and/or disable the write operation so that memory cells 12c and 12d of the selected row of memory cells remain in their existing memory states "0" and "1", respectively, in this regard, a "write de-select" voltage pulse is applied to bit lines $32_{j+2}$ and $32_{j+3}$ to prevent, inhibit and/or disable the write operation with respect to memory cells 12c and 12d by preventing, minimizing, eliminating and/or blocking charge loss for the case of a cell previously written to logic state "1" (here, memory cell 12c), or preventing, minimizing, eliminating bipolar current generation for the case of a cell previously written to logic state "0" (here, memory cell 12d). With the application of the de-select control signal to bit lines $32_{j+2}$ and $32_{j+3}$. the data states of memory cells 12c and 12d are not disturbed or adversely affected—notwithstanding that such memory cells are a portion of the selected row of memory cells (based on address data). Notably, the de-select control signals may be applied to bit lines $32_{j+2}$ and $32_{j+3}$ as a voltage pulse, as illustrated in FIG. 17, during the write operation or may be applied continuously to bit lines $32_{j+2}$ and $32_{j+3}$, as illustrated in FIG. 18.

With reference to FIGS. 16-19 in an exemplary embodiment, control signals, having predetermined amplitude, are selectively applied (based on address data) to a predetermined or given row of memory cells (for example, memory cells 12a-d which are connected to the same word line, namely word line $28_i$) to read selected memory cells 12a and 12b. Concurrently therewith, exemplary "read de-select" control signals, having predetermined amplitude, are applied to unselected memory cells 12c and 12d to prevent, inhibit and/or disable the read operation so that memory cells 12c and 12d of the selected row of memory cells are not impacted by the read operation. In this regard, a "read de-select" voltage pulse or constant voltage is applied to bit lines $32_{j+2}$ and $32_{j+3}$ to prevent, inhibit and/or disable the read operation with respect to memory cells 12c and 12d—notwithstanding that such memory cells are a portion of the selected row of memory cells. As such, memory cells 12c and 12d are not read, impacted and/or adversely affected by the read operation. In this embodiment, memory cells 12c and 12d do not significantly conduct current during a read operation and are not disturbed—not withstanding the access of the row of memory cells via word line $28_i$.

The voltage amplitudes illustrated in FIGS. 15-19 (among others) to perform selected operations (for example, read, write, read de-select, write de-select, hold) are merely exemplary. The indicated voltage levels may be relative or absolute. Alternatively, as mentioned above, the voltages indicated may be relative in that each voltage level, for example, may be increased or decreased by a given voltage amount (for example, each voltage may be increased/decreased by 0.25, 0.5, 1.0 and 2.0 volts (or more)) whether one or more of the voltages (for example, the source, drain or gate voltages) become or are positive and negative.

Notably, the present inventions may have several advantages over prior art techniques which typically include a long row memory cell array for area efficiency with pipeline techniques because of the resulting difference between array word length and input/output word length. Because with the present inventions, the selected memory cells of the selected row are written or read and unselected memory cells of the selected row are not adversely affected by the predetermined operation, the word length of the memory array may be the same as the input/output word length in spite of maintaining a long row memory cell array for area efficiency. In the present inventions, the selected memory cells of the selected row is written or read (while the unselected memory cells of the selected row do not participate in or are not adversely affected by the operation) so in cases where data addresses are not consecutive and pipeline techniques are not effective, power management is enhanced because the unselected memory cells (which are presumably not needed) are not read from during the read operation or written into during the write operation.

In addition, because memory cell array word length and input/output word length are the same, data may be written into or read from the memory array in a single step or stage which may provide for faster operation and/or lower power consumption. In this regard, conventional techniques often employ a two step or stage write to first write data into latches and then write data from latches to memory cells. Similarly, for read operations, data is first read from the memory cell array into latches and thereafter to the output. The present inventions also allow the word length to be changed between operations at any time, for example, by control of the data write and sense circuitry and memory cell selection and control circuitry.

The word length may be set and/or controlled, for example, at fabrication, during test, and/or in situ. For example, the integrated circuit device may be programmed (i) after power-up, for example, during an initialization phase, or (ii) during operation to minimize power consumption and maximize speed. For example, during operation, the word length of the random accesses may be set to match the I/O width for maximum speed. However, where the data addresses are consecutive, a word length may be set to equal the number of physical bits on a row so data would first be written to latches and then written to an entire row in one operation for lower power consumption. Consecutive data addresses may be indicated by an external input to the memory of the integrated circuit, or consecutive addresses could be detected internal to the memory of the integrated circuit. With respect to refresh operations for which no data is input or output from the memory but all bits on a row must be refreshed, a word length equal to the number of physical bits on a row may be set. In this way, power consumption may be reduced and/or minimized.

Figure 20A:
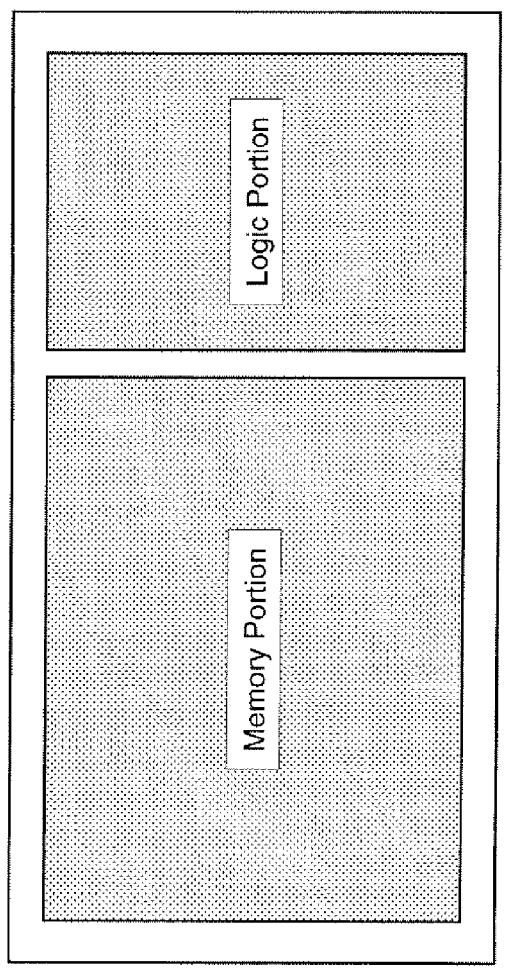
FIGS. 20A-20O are schematic block diagram illustrations of exemplary integrated circuit devices in which the memory cell array (and certain peripheral circuitry) may be implemented, according to one or more aspects of the present inventions.

Notably, word length of the memory array of the integrated circuit (for example, a processor device or a discrete memory device) may be one time programmable (for example, programmed during test or at manufacture) or more than one time programmable (for example, during test, start-up/power-up, during an initialization sequence and/or during operation (in situ)). For example, in one embodiment, the word length may be "stored" in word length selection circuitry that resides on the integrated circuit (for example, fuses or anti-fuses, or DRAM, SRAM, ROM, PROM, EPROM, EEPROM cells, latches, registers, and/or fixed via, for example, voltages applied to signal lines or pins). (See, for example, FIGS. 20C and 20D). Indeed, any programming technique and/or circuitry, whether now known or later developed, are intended to fall within the scope of the present inventions.

The control circuitry to determine, implement and/or program the word length may be implemented on-chip, which is resident on (i.e., integrated in) the device, or off-chip (i.e., disposed on or in a different integrated circuit device, for example, disposed on/in a memory controller, microprocessor and/or graphics processor). The control circuitry may implement any programming technique and/or circuitry, whether now known or later developed; all such techniques and circuitry are intended to fall within the scope of the present inventions.

Figure 20B:
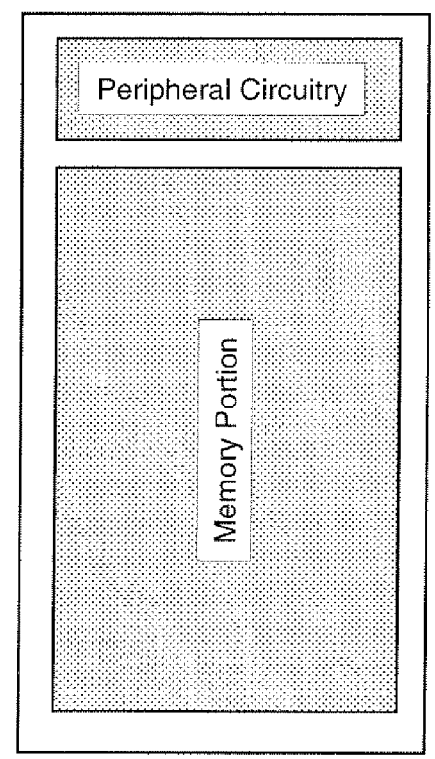
FIGS. 20D and 20E are schematic block diagrams of embodiments of an integrated circuit device including, among other things, a memory cell array, data sense and write circuitry, memory cell selection and control circuitry, according to one or more aspects of the present inventions.
Figure 20C:
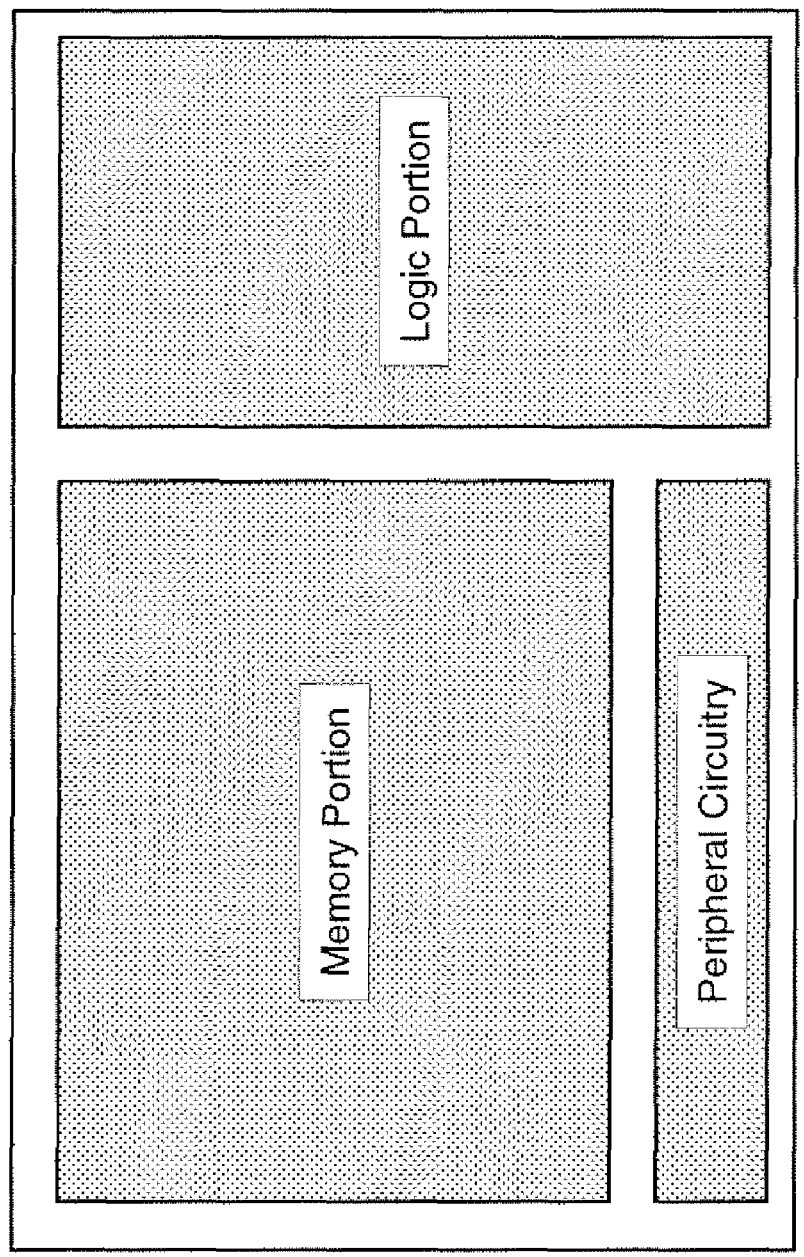

As noted above, the memory cell and/or memory cell array, as well as the circuitry of the present inventions may be implemented in an integrated circuit device having a memory portion and a logic portion (see, for example, FIGS. 20A and 20C), or an integrated circuit device that is primarily a memory device (see, for example, FIG. 20B). The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 20D:
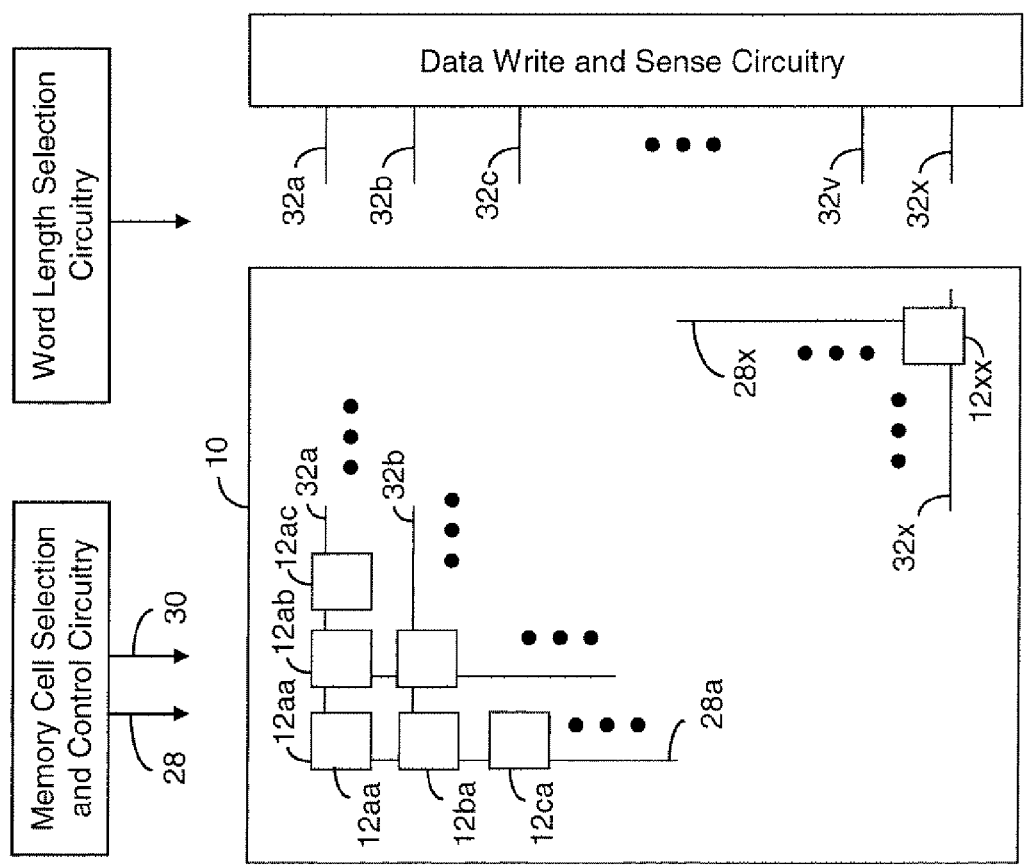
Figure 20E:
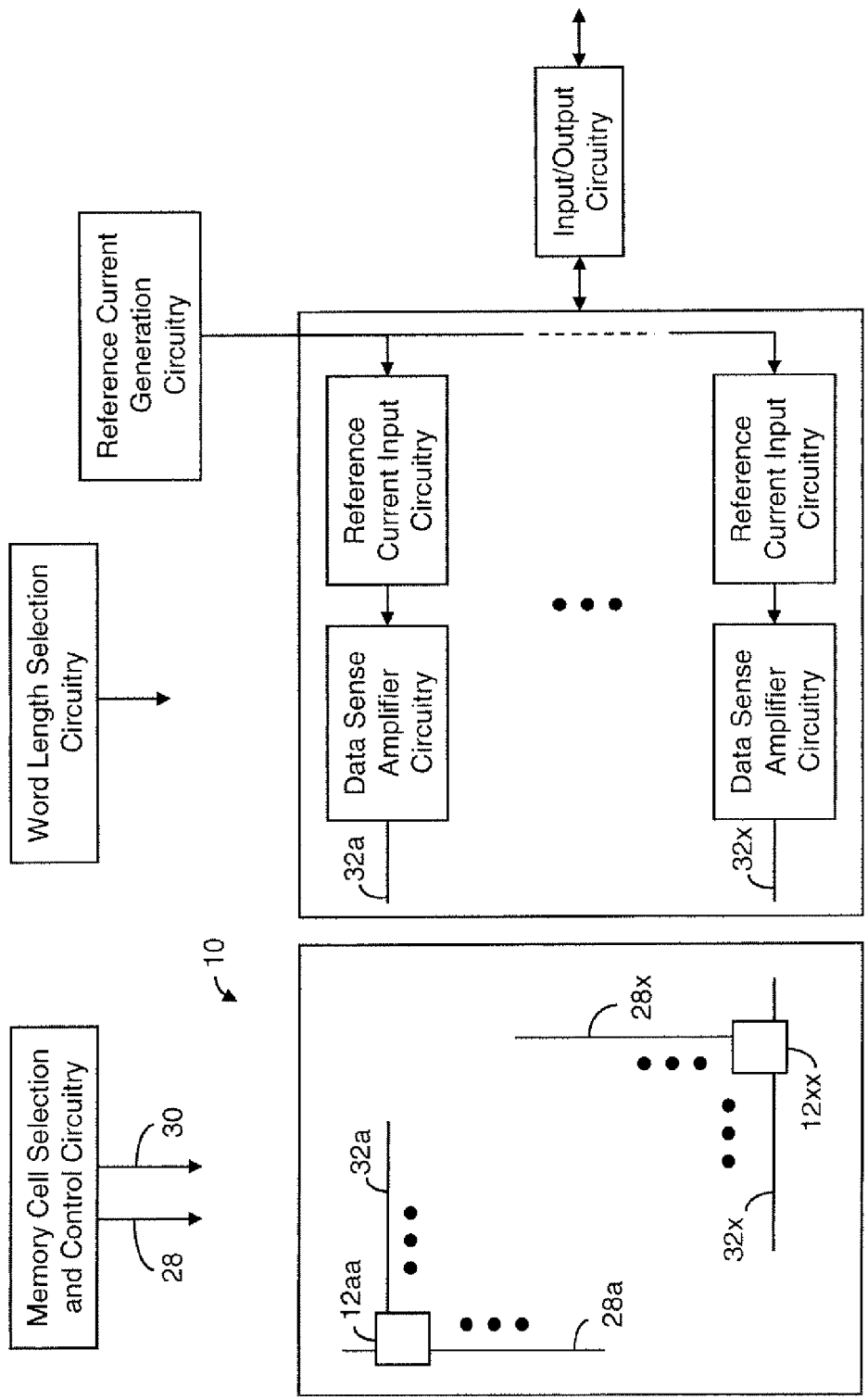

For example, with reference to FIGS. 20D and 20E, the integrated circuit device may include array 10, having a plurality of memory cells 12, data write and sense circuitry, and memory cell selection and control circuitry. The data write and sense circuitry reads data from and writes data to selected memory cells 12. In one embodiment, the data write and sense circuitry includes a plurality of data sense amplifiers. Each data sense amplifier receives at least one bit line 32 and an output of reference generator circuitry (for example, a current or voltage reference signal). In one embodiment, the data sense amplifier may be one or more of the cross-coupled type sense amplifiers like the cross-coupled type sense amplifier described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

The present inventions may be implemented in any electrically floating body memory cell and memory cell array. (See, for example, the Background section above). Indeed, in certain aspects, the present inventions are a memory array, having a plurality of memory cells each including an electrically floating body transistor, and/or technique of writing or programming data into one or more memory cells of such a memory array. In this aspect of the inventions, the data states of adjacent memory cells and/or memory cells that share a word line may be individually programmed. In addition, although the present inventions has been described, by way of example, in the context of an embodiment of the '188 application, the present inventions may be implemented in or with other memory cell and memory array technologies, for example, 1T-1C (one transistor, one capacitor) and electrically floating gate memory cells.

Figure 1A:
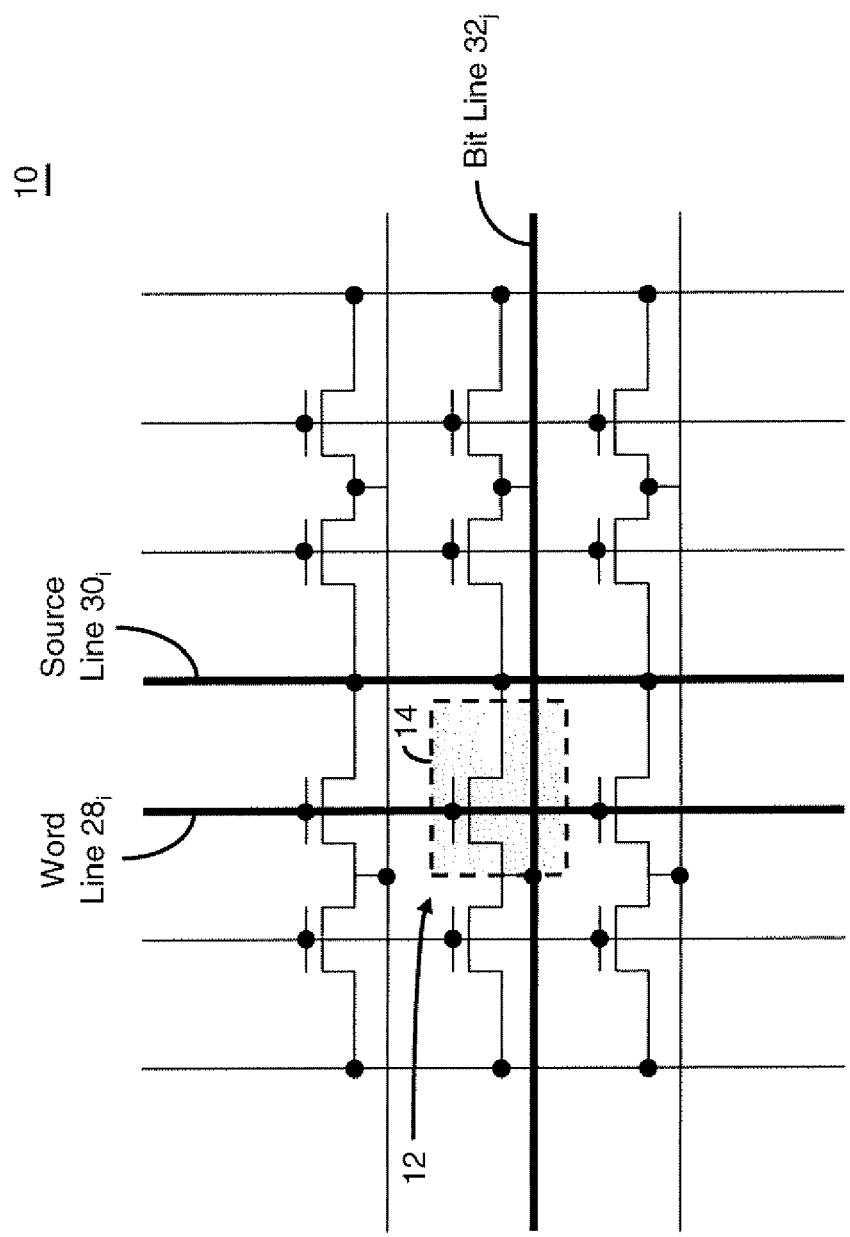
FIG. 1A is a schematic representation of a prior art DRAM array including a plurality of memory cells comprised of one electrically floating body transistor.
Figure 1B:
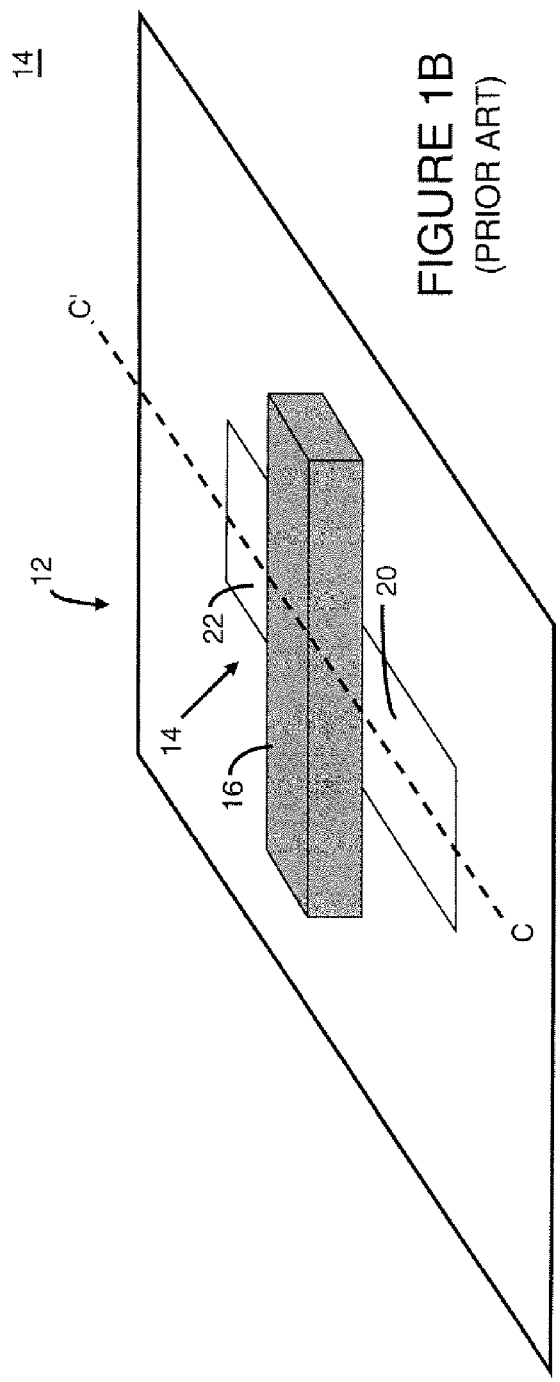
FIG. 1B is a three dimensional view of an exemplary prior art memory cell comprised of one electrically floating body transistor (PD-SOI NMOS)
Figure 1C:
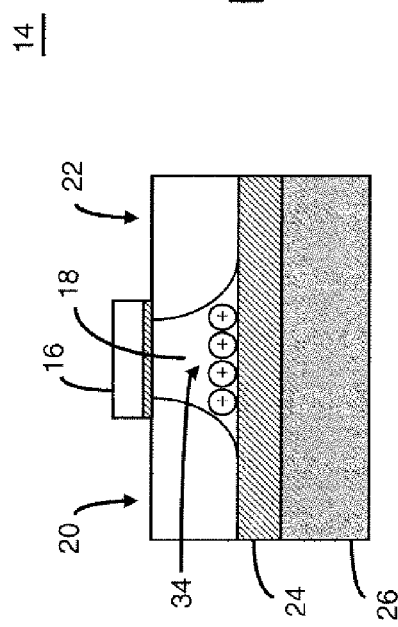
FIG. 1C is a cross-sectional view of the prior art memory cell of FIG. 1B, cross-sectioned along line C-C'.
Figure 2A:
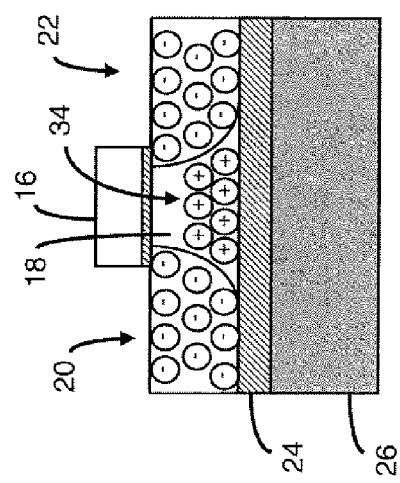
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
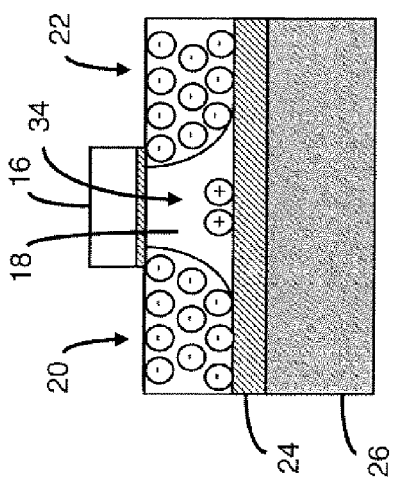
Figure 3A:
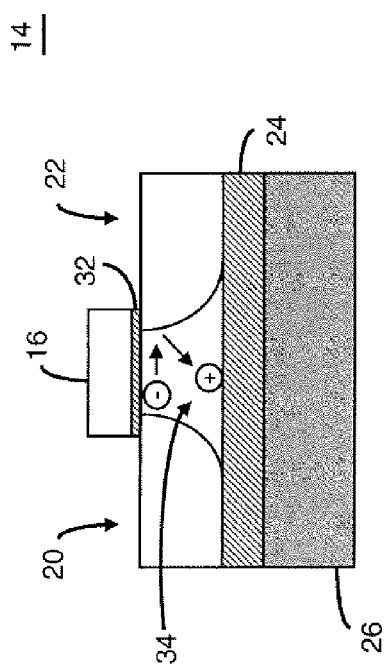
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B))
Figure 3B:
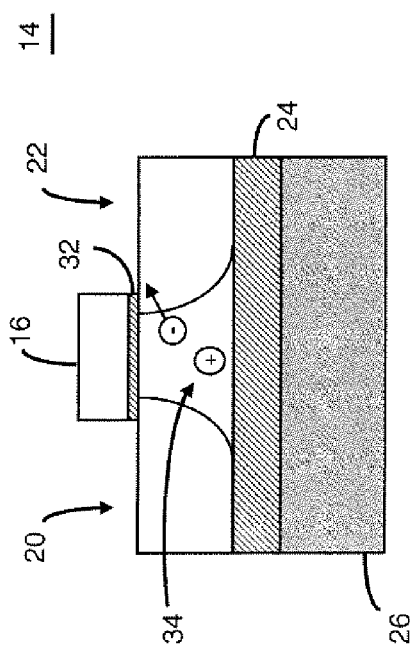
Figure 5:
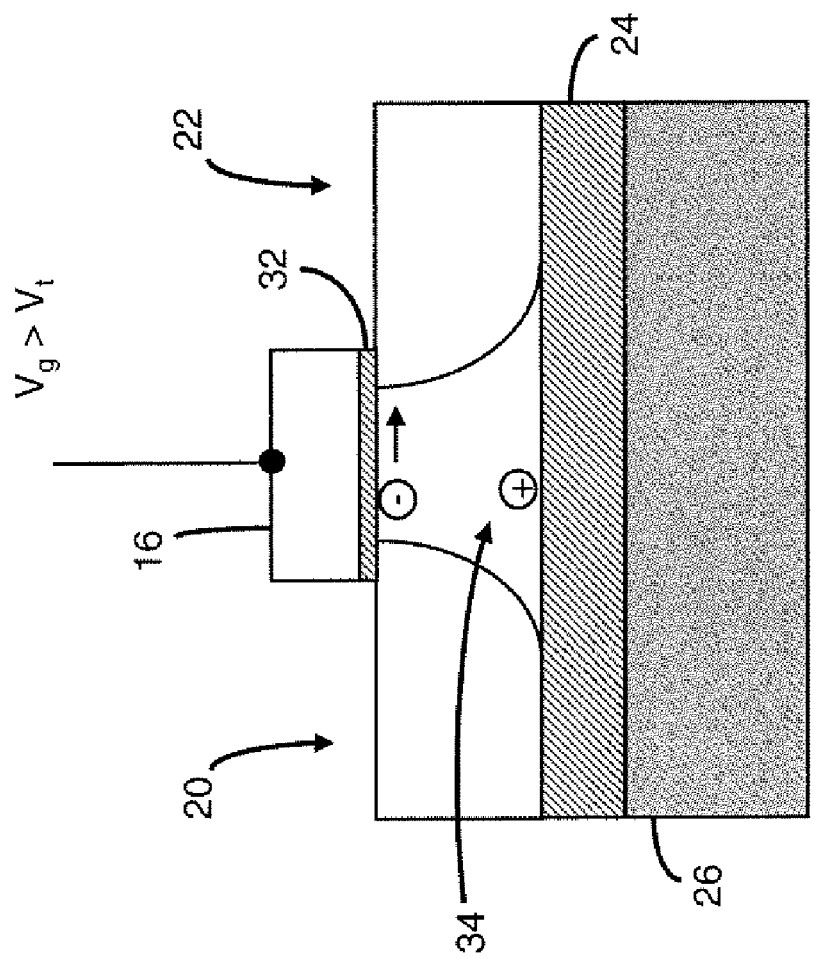
FIG. 5 illustrates an exemplary schematic (and control signal) of a conventional reading technique, the state of the memory cell may be determined by sensing the amount of the channel current provided/generated in response to the application of a predetermined voltage on the gate of the transistor of the memory cell.
Figure 6:
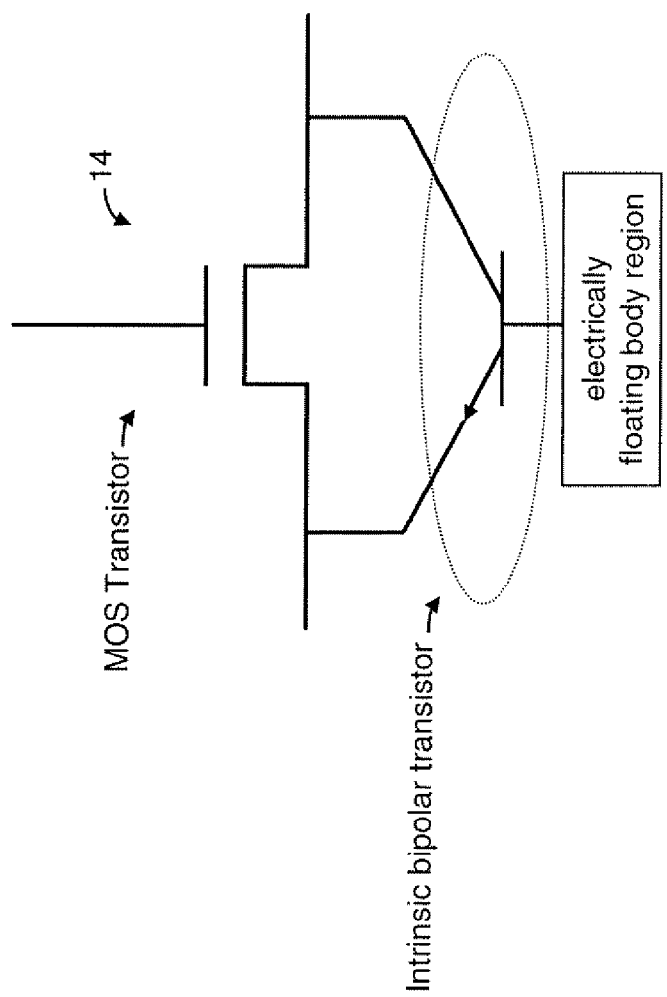
FIG. 6 is a schematic representation of an equivalent electrically floating body memory cell (N-channel type) including an intrinsic bipolar transistor in addition to the MOS transistor.
Figure 7:
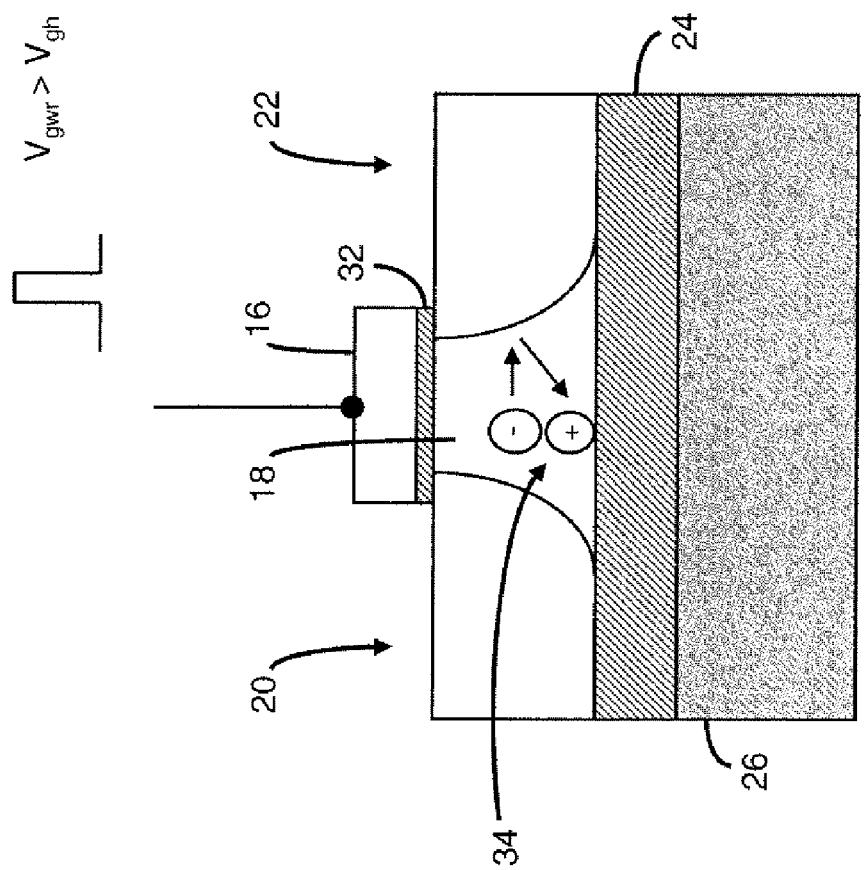
FIG. 7 illustrates an exemplary schematic (and control signal voltage relationship) of an exemplary embodiment of an aspect of the '188 application of programming a memory cell to logic state "1" by generating, storing and/or providing an excess of majority carriers in the electrically floating body of the transistor of the memory cell.
Figure 8:
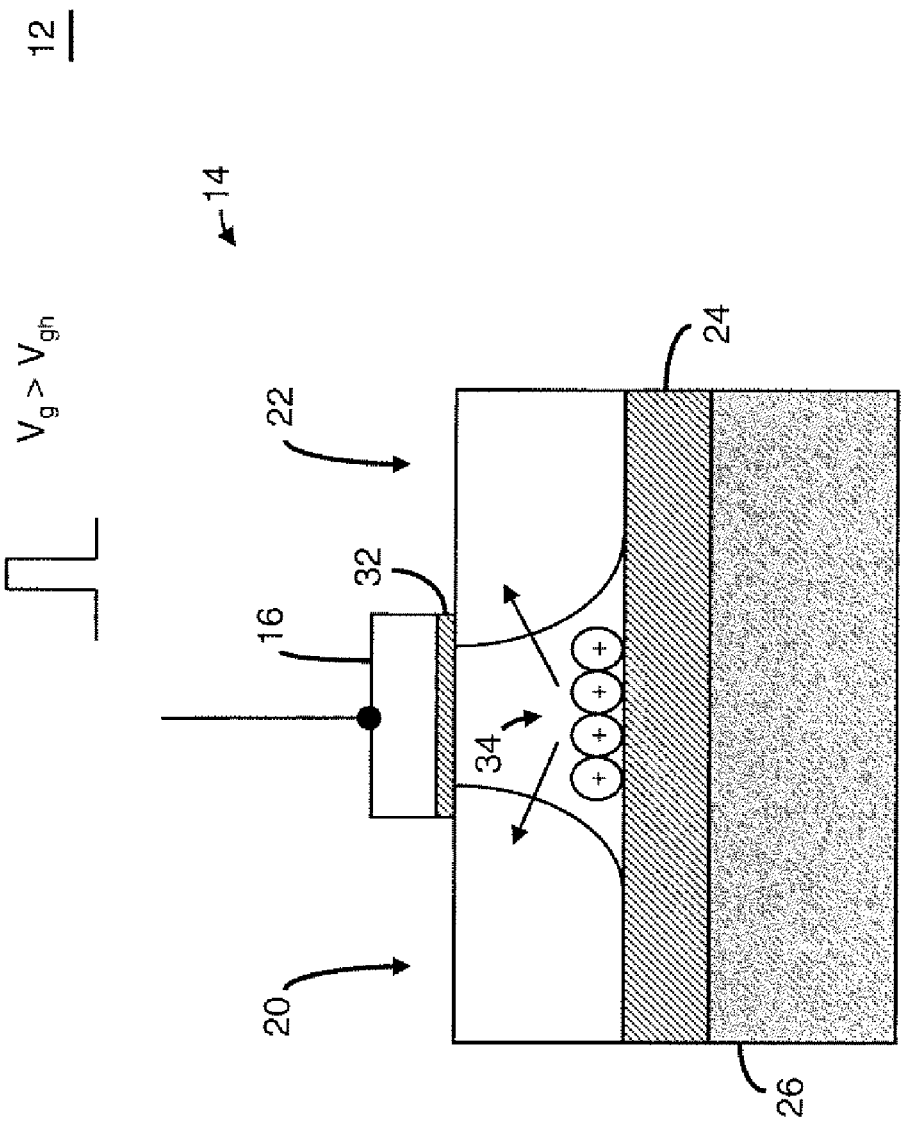
FIG. 8 illustrates an exemplary schematic (and control signals) of an exemplary embodiment of an aspect of the '188 application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell.
Figure 9:
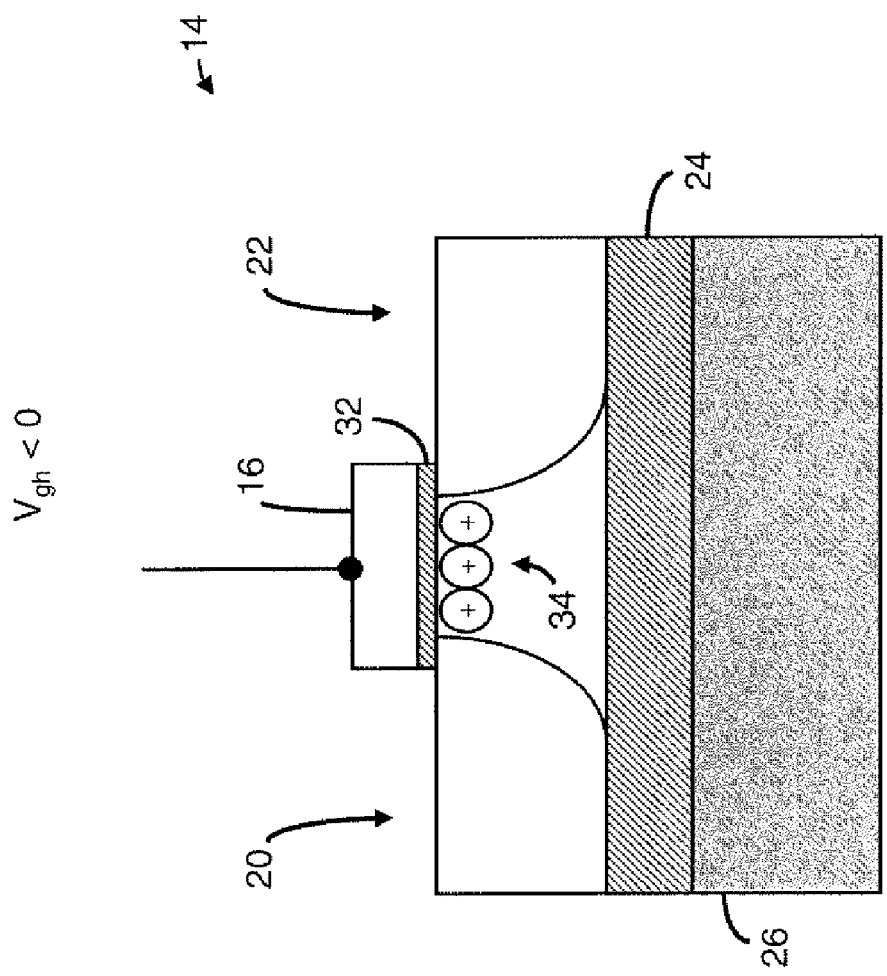
FIG. 9 illustrates an exemplary schematic (and control signals) of an exemplary embodiment of an aspect of the '188 application of holding or maintaining the data state of a memory cell.
Figure 10:
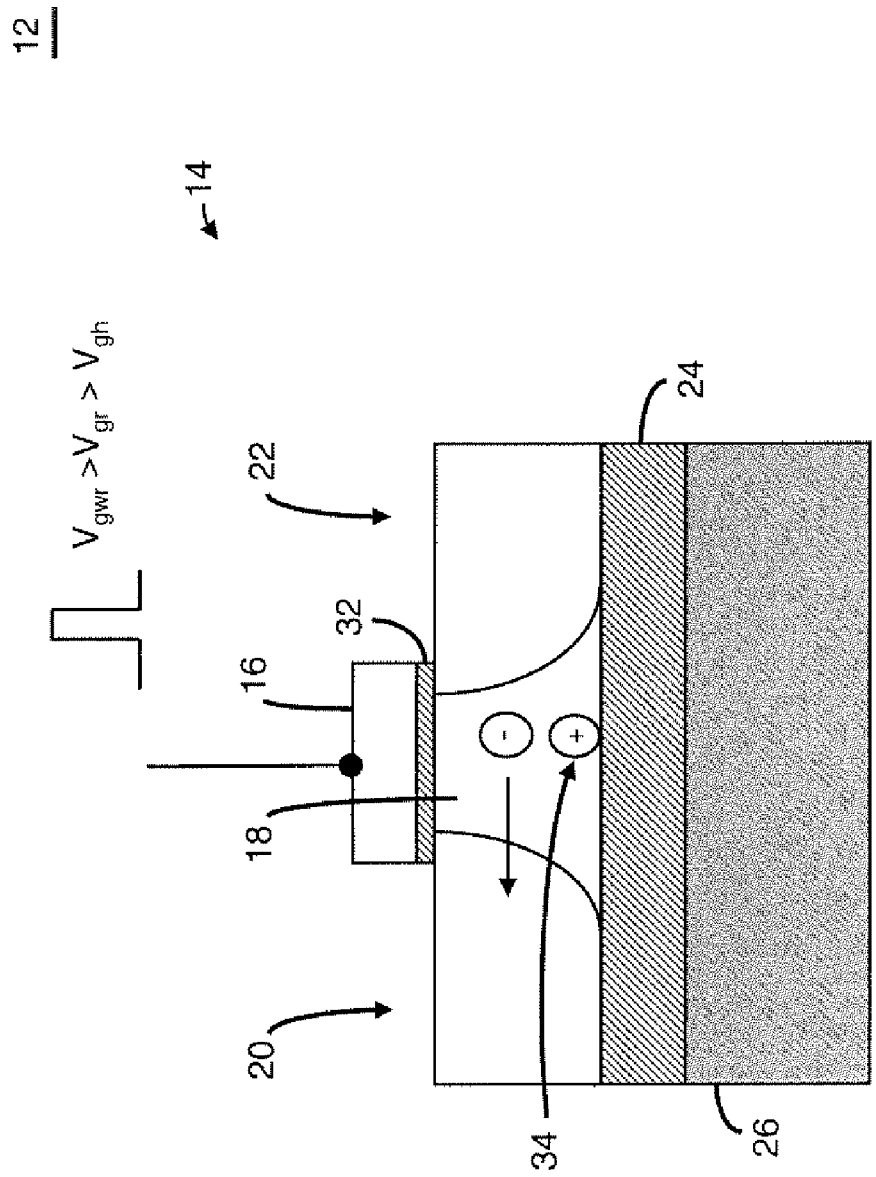
FIG. 10 illustrates an exemplary schematic (and control signals) of an exemplary embodiment of an aspect of the '188 application of reading the data state of a memory cell by sensing the amount of the current provided/generated in response to an application of a predetermined voltage on the gate of the transistor of the memory cell.
Figure 11:
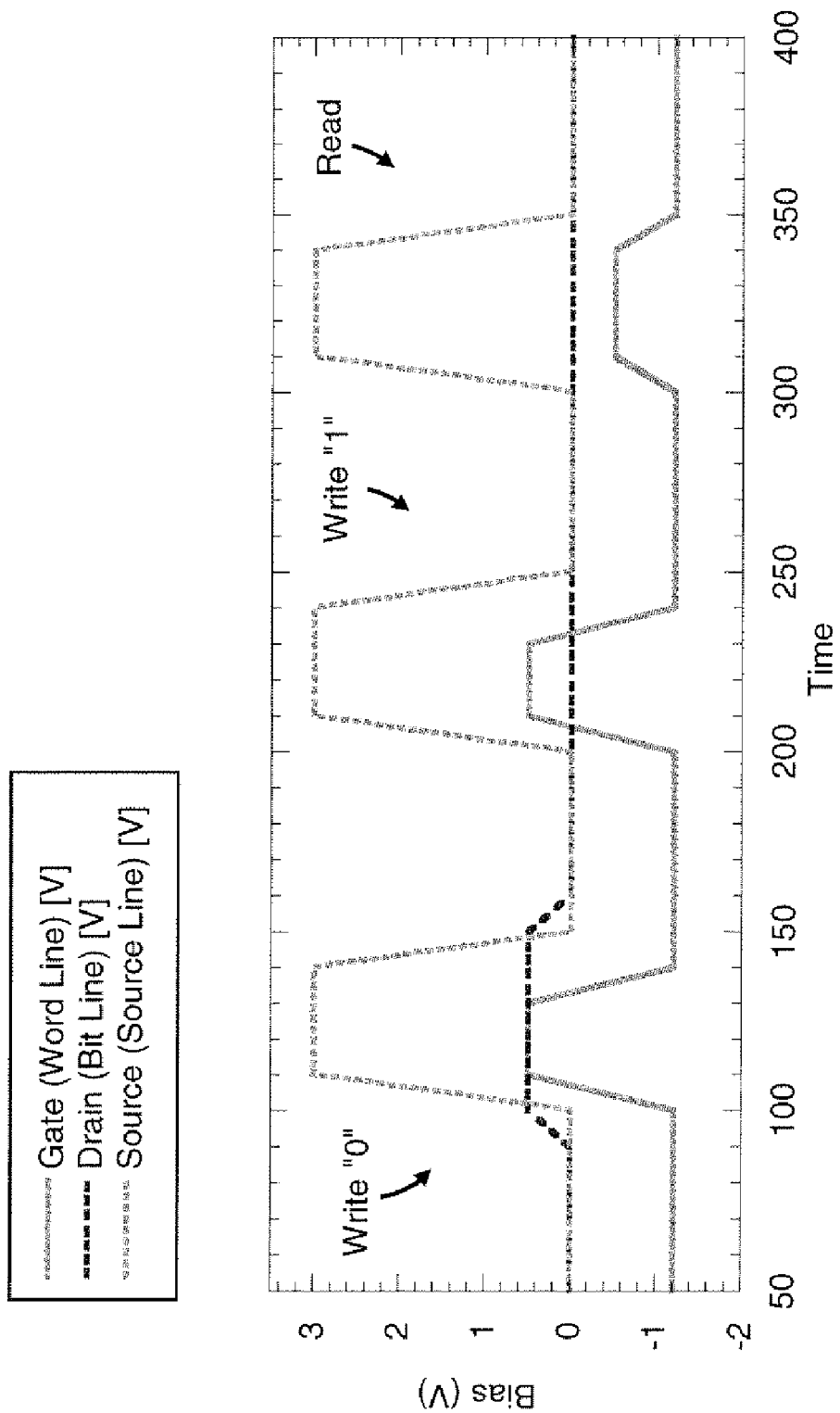
FIG. 11 illustrates exemplary timing relationships of selected write control signals to (i) program or write a logic state "1" into one or more N-channel type memory cells, (ii) program or write logic state "0" into one or more N-channel type memory cells, and (iii) read one or more N-channel type memory cells according to one embodiment of the inventions described and illustrated in the '188 application.
Figure 12:
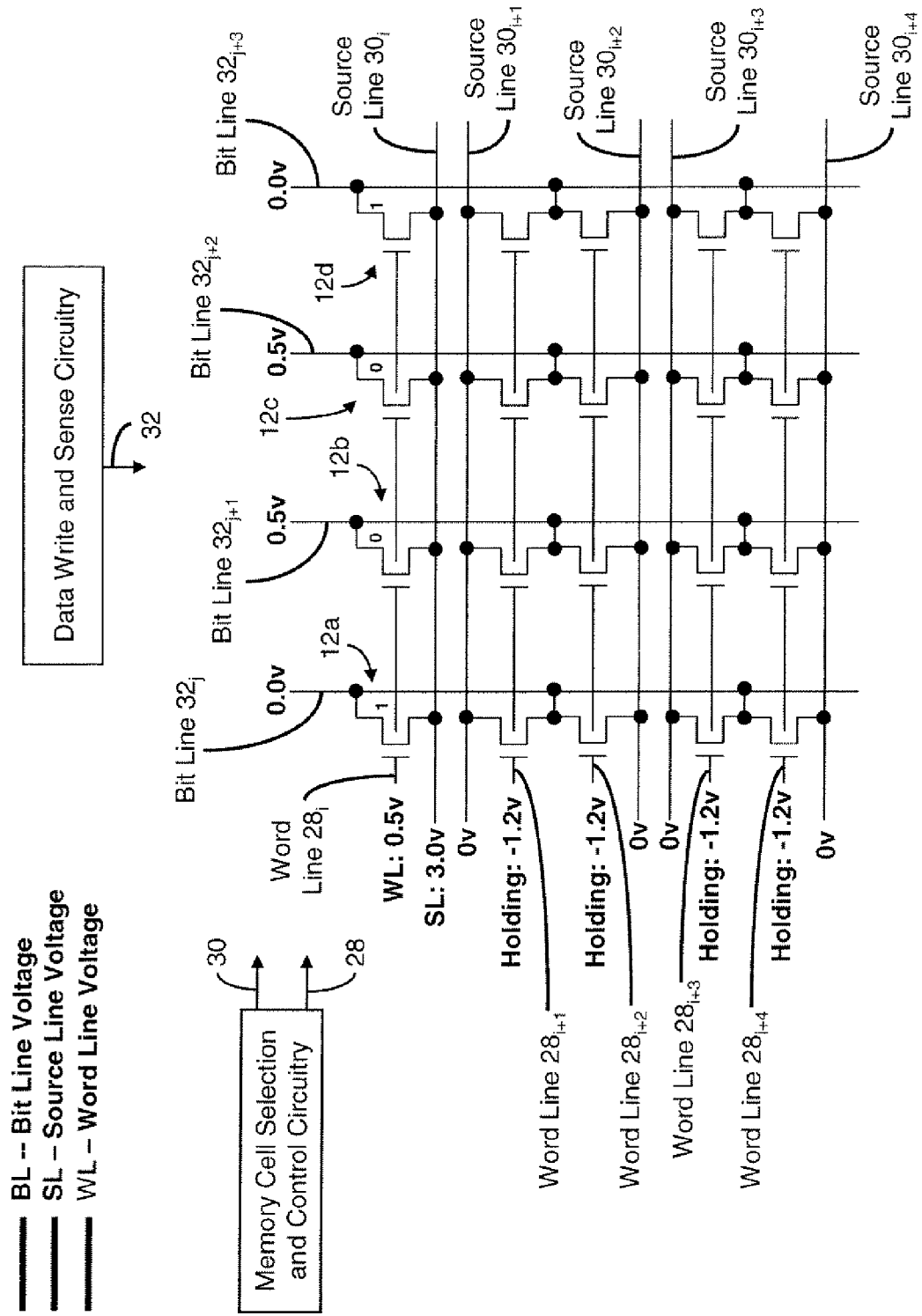
FIGS. 12 and 13 illustrate an exemplary embodiment of a memory array having a plurality of memory cells (N-channel type) and employing a separated source line configuration for each row of memory cells in conjunction with exemplary programming techniques, including exemplary control signal voltage values (FIG. 11) and exemplary reading techniques, including exemplary control signal voltage values (FIG. 12), according to certain aspects of the inventions described and illustrated in the '188 application.
Figure 13:
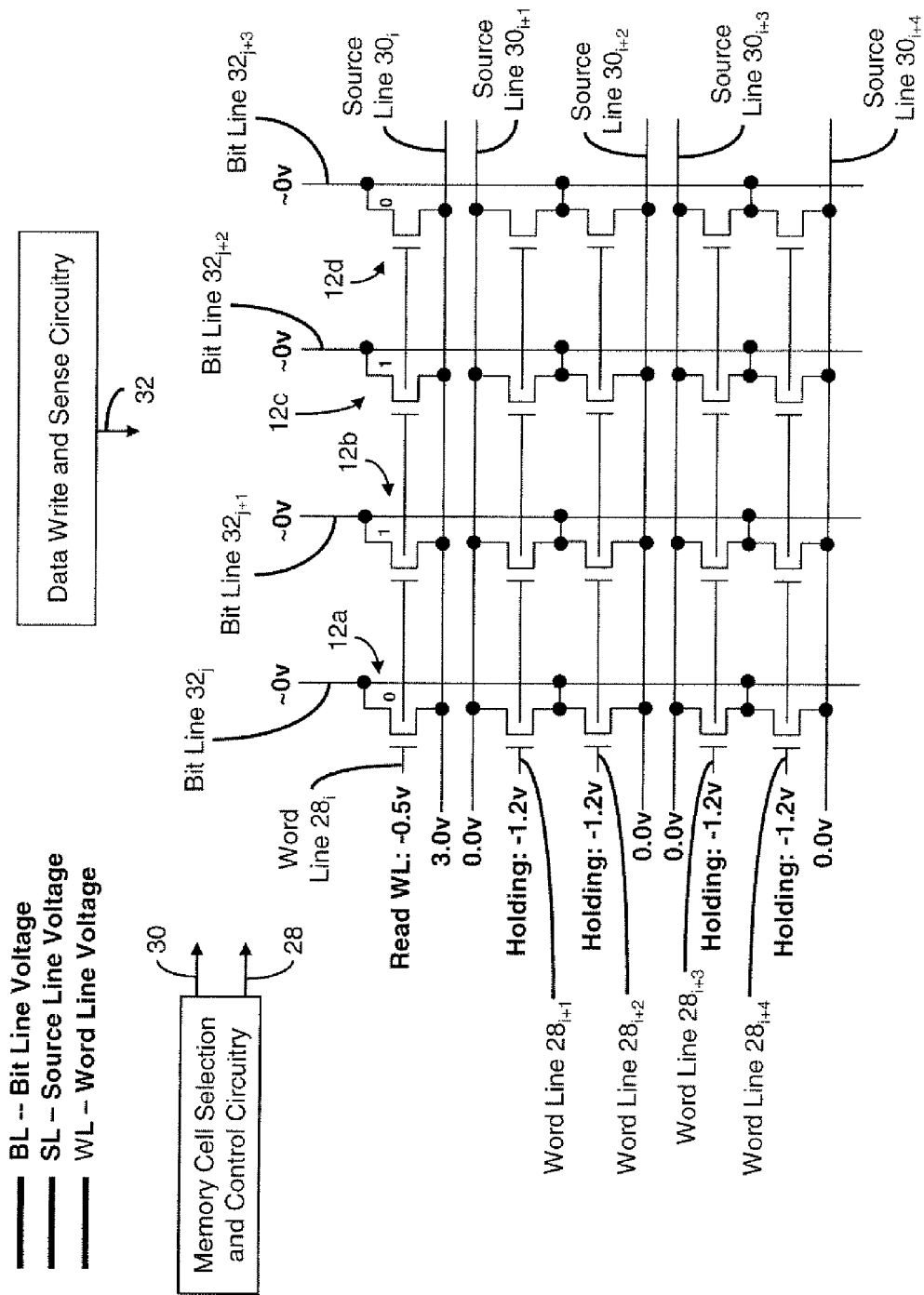
Figure 14:
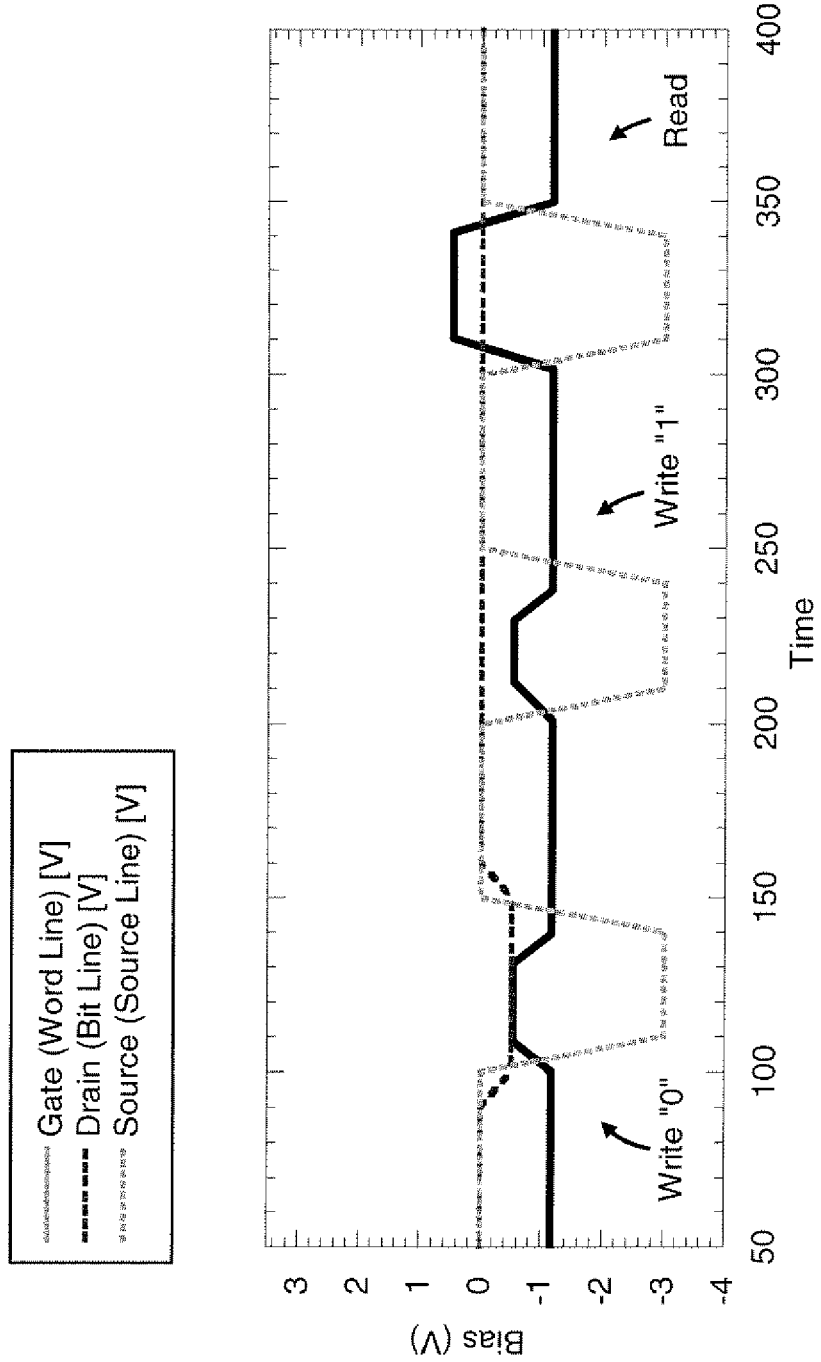
FIG. 14 illustrates exemplary timing relationships of selected write control signals to (i) program or write a logic state "1" into one or more P-channel type memory cells, (ii) program or write logic state "0" into one or more P-channel type memory cells, and (iii) read one or more P-channel type memory cells according to one embodiment of the '188 application.

The memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors.

Where P-channel type transistors are employed as memory cells 12 in the memory array(s), there are many suitable write and read voltages (for example, negative voltages). (See, for example, FIG. 14). For example, the data may be read from P-channel type memory cells by applying a voltage pulse of −3V to the source region, and a voltage pulse of 0.5V may be applied to the gate of the memory cells to be read. In this embodiment, the source pulse may be applied to the source region before application of the gate pulse to the gate, simultaneously thereto, or after the gate pulse is applied the gate. Further, the source pulse may cease or terminate before the gate pulse, simultaneously thereto (as illustrated in FIG. 14), or after the gate pulse concludes or ceases.

As mentioned above, the circuitry and techniques of the present inventions may be employed in conjunction with any electrically floating body memory cell (i.e., a memory cell including at least one electrically floating body transistor), and/or architecture, layout, structure and/or configuration employing such electrically floating body memory cells (among other types of memory cells). For example, an electrically floating body transistor, whose state is read, programmed and/or controlled using the techniques of the present inventions, may be implemented in the memory cell, architecture, layout, structure and/or configuration described and illustrated in the following provisional and non-provisional U.S. patent applications:

(1) U.S. Non-Provisional patent application Ser. No. 10/450,238, which was filed by Fazan et al, on Jun. 10, 2003 and entitled "Semiconductor Device" (now U.S. Pat. No. 6,969,662);

(2) U.S. Non-Provisional patent application Ser. No. 10/487,157, which was filed by Fazan et al. on Feb. 18, 2004 and entitled "Semiconductor Device" (now U.S. Pat. No. 7,061,050);

(3) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) U.S. Non-Provisional patent application Ser. No. 11/096,970, which was filed by Ferrant et al. and entitled "Semiconductor Memory Device and Method of Operating Same" (now U.S. Pat. No. 7,085,156);

(5) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No, 2005/0063224);

(6) U.S. Non-Provisional patent application Ser. No. 11/304,387, which was filed by Okhonin et al. on Dec. 15, 2005 and entitled "Bipolar Reading Technique for a Memory Cell Having an Electrically Floating Body Transistor" (U.S. Patent Application Publication No. 2006/0131650);

(7) U.S. Non-Provisional patent application Ser. No. 11/453,594, which was filed by Okhonin et al. on Jun. 15, 2006 and entitled "Method for Reading a Memory Cell Having an Electrically Floating Body Transistor, and Memory Cell and Array Implementing Same";

(8) U.S. Non-Provisional patent application Ser. No. 11/509,188, which was filed by Okhonin et al. filed on Aug. 24, 2006, and entitled "Memory Cell and Memory Cell Array Having an Electrically Floating Body Transistor, and Methods of Operating Same" (referred to above);

(9) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same";

(10) U.S. Non-Provisional patent application Ser. No. 11/590,147, which was filed by Popov et al. on Oct. 31, 2006, and entitled "Method and Apparatus for Varying the Programming Duration of a Floating Body Transistor, and Memory Cell, Array, and/or Device implementing Same"; and

(11) U.S. Non-Provisional patent application Ser. No. 11/703,429, which was filed by Okhonin et al. on Feb. 7, 2007, and entitled "Multi-Bit Memory Cell Having Electrically Floating Body Transistor, and Method of Programming and Reading Same".

The entire contents of these eleven (11) U.S. patent applications, including, for example, the inventions, features, attributes, architectures, configurations, materials, techniques and advantages described and illustrated therein, are incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells (having one or more transistors) may be controlled (for example, programmed or read) using any of the control circuitry described and illustrated in the above-referenced eleven (11) U.S. patent applications. For the sake of brevity, those discussions will not be repeated and are incorporated herein by reference. Indeed, all memory cell selection and control circuitry, and techniques for programming, reading, controlling and/or operating memory cells including transistors having electrically floating body regions, whether now known or later developed, are intended to fall within the scope of the present inventions.

For example, the data stored in or written into memory cells 12 of DRAM array/device 10 may be read using well known circuitry and techniques (whether conventional or not), including those described in the above-referenced eleven (11) U.S. patent applications. The present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150).

In addition, the present inventions may employ the read operation techniques described and illustrated in U.S. patent application Ser. No. 11/515,667, which was filed by Bauser on Sep. 5, 2006, and entitled "Method and Circuitry to Generate a Reference Current for Reading a Memory Cell, and Device Implementing Same". The entire contents of the U.S. patent application Ser. No. 11/515,667, as noted above, are incorporated herein by reference.

Moreover, a sense amplifier (not illustrated in detail) may be employed to read the data stored in memory cells 12. The sense amplifier may sense the data state stored in memory cell 12 using voltage or current sensing techniques. In the context of a current sense amplifier, the current sense amplifier may compare the cell current to a reference current, for example, the current of a reference cell (not illustrated). From that comparison, it may be determined whether memory cell 12 contained a logic high (relatively more majority carriers 34 contained within body region 18) or logic low data state (relatively less majority carriers 34 contained within body region 18).

The electrically floating memory cells, transistors and/or memory array(s) may be fabricated using well known techniques and/or materials. Indeed, any fabrication technique and/or material, whether now known or later developed, may be employed to fabricate the electrically floating body memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157, which was filed by Fazan et al. on Feb. 18, 2004 and entitled "Semiconductor Device" (U.S. Patent Application Publication No. 2004/0238890). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, the plurality of memory cells 12 of the present inventions may be implemented in any memory array having, for example, a plurality of rows and columns (for example, in a matrix form). The present inventions may be implemented in any electrically floating body memory cell and memory cell array. In addition, as noted above, the present inventions may be implemented in other memory cell and memory array technologies, for example, 1T-1C (one transistor, one capacitor) and electrically floating gate memory cells.

Notably, for those unselected memory cells associated with non-enabled or unselected word lines which are not written during a programming operation, a holding condition may be applied or established to prevent, minimize or avoid disturbance of the data state of, or charge stored in the memory cells of the unselected rows of memory cells. In this regard, a voltage (for example, −1.2V) may be applied to the gates of the memory cells of the unselected rows of memory cells and a voltage (for example, 0V) may be applied to the source and drain regions of the memory cells of the unselected rows of memory cells to prevent, minimize or avoid disturbance of the data state in the memory cells of the unselected rows of memory cells during the programming or writing operation. Under these conditions, the data state of the memory cells of the unselected rows of memory cells is unaffected (or substantially unaffected) by the programming of or writing to selected memory cells of the selected rows. (See, for example, FIG. 15).

Further, for those memory cells coupled to non-enabled or unselected word lines which are not read during a read operation, a holding condition may be applied or established to prevent, minimize or avoid disturbance of the data state in the memory cells of the unselected rows of memory cells of the array. In this regard, a voltage (for example, −1.2V) may be applied to the gates of the unselected memory cells and a voltage (for example, 0V) may be applied to the source regions of the memory cells of the unselected rows of memory cells to prevent, minimize or avoid disturbance of the data state in the unselected memory cells during the read operation. Under these conditions, the states of the memory cells of the unselected rows of memory cells are unaffected (or it is substantially unaffected) during the reading of selected memory cells of the selected rows of memory cells. (See, for example, FIG. 16).

As noted above, the word length of the array may be one time programmable (for example, programmed during test, design or at manufacture) or more than one time programmable (for example, during test, start-up/power-up, during an initialization sequence and/or during operation (in situ)). For example, in one embodiment, data which is representative of the word length may be stored in on-chip word length selection circuitry (for example, in fuses or anti-fuses, or DRAM, SRAM, ROM, PROM, EPROM, EEPROM cells, latches, and/or registers which is/are resident on or integrated in the device). The on-chip word length selection circuitry may be disposed, in whole or in part, in the logic portion and/or peripheral portion of the integrated circuit device, (See, for example, FIGS. 20A-20O).

Figure 21A:
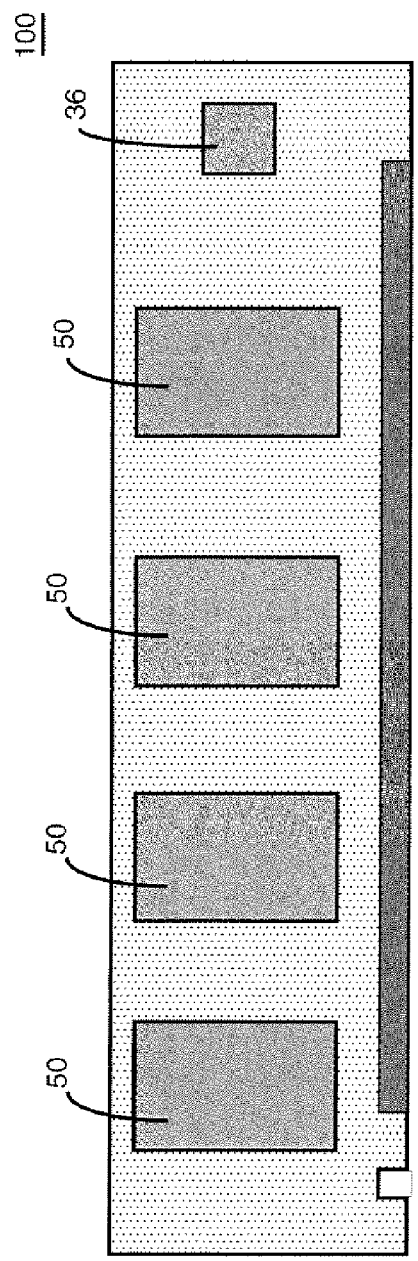
FIGS. 21A-21C are schematic representations of exemplary architectures and/or embodiments of implementing a controller/processor in conjunction with memory devices having a programmable word length, in accordance with one or more aspects of the present inventions.
Figure 21B:
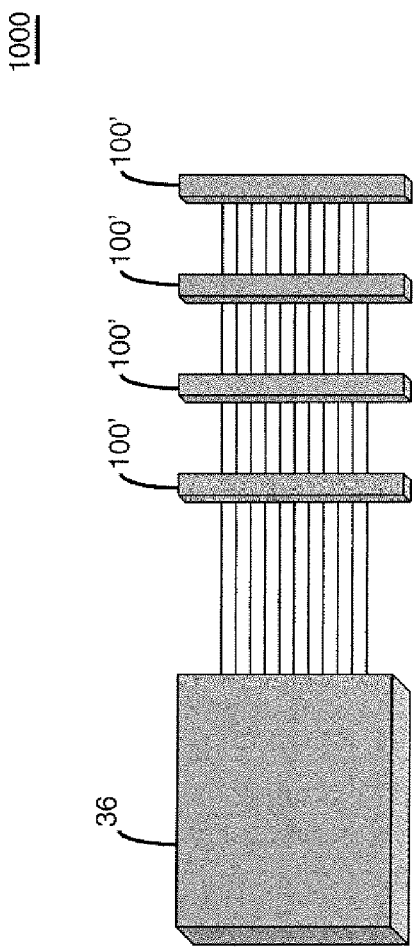
Figure 21C:
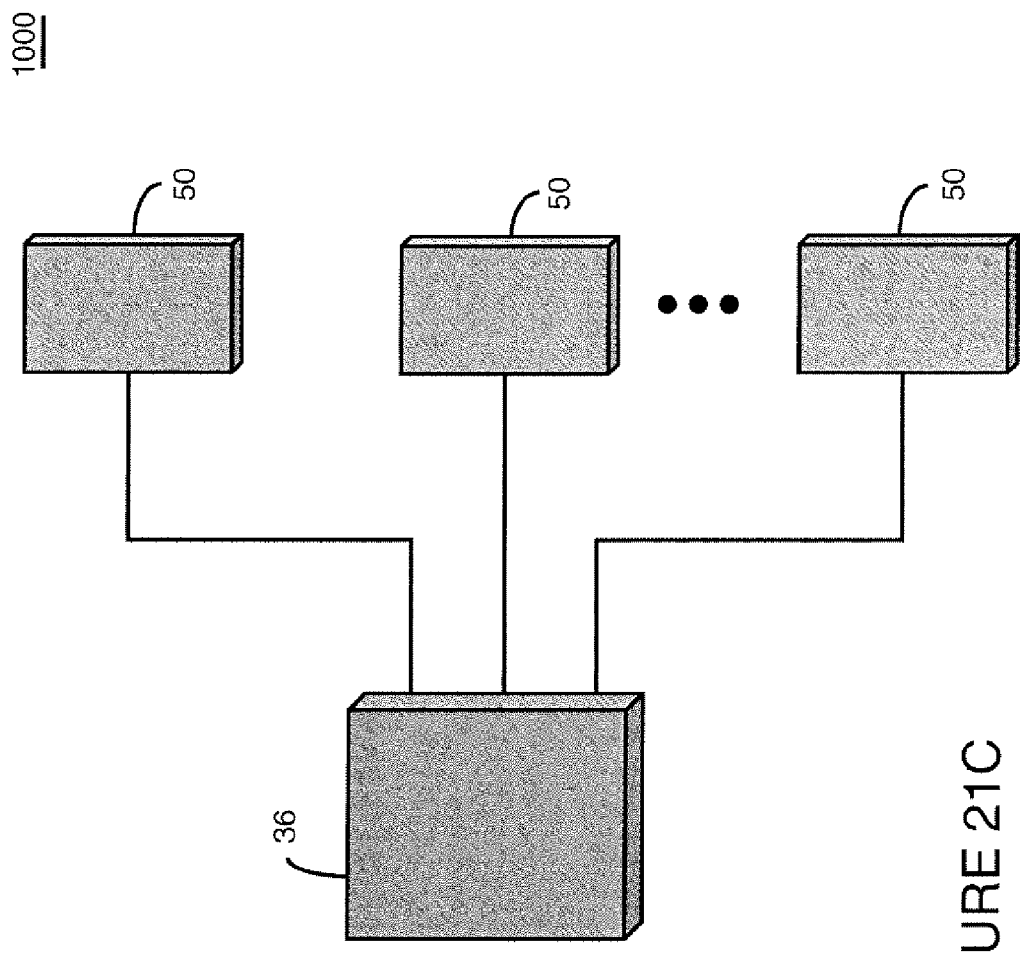

In addition thereto or in lieu thereof, the word length selection circuitry may be located, in whole or in part, on-chip (for example, in fuses or anti-fuses, or DRAM, SRAM, ROM, PROM, EPROM, EEPROM cells, latches, and/or registers) and the circuitry that programs such word length selection circuitry may be located off-chip. In this regard, with reference to FIGS. 21A-21C, word length selection circuitry (which, in this embodiment, is on-chip) may be programmed via circuitry located or disposed in external controller/processor 36 (for example, memory controller, microprocessor and/or graphics processor). The external controller/processor 36 may be implemented on module 100 (see, for example, FIG. 21A), in system 1000 having a distributed bus architecture (see, for example, FIG. 21B), and/or in system 1000 having a point-point architecture (see, for example, FIG. 21C). In each embodiment, controller/processor 36 may provide information to memory device 50 which, in response, controls the word length of the array within memory device 50.

For example, as mentioned above, the illustrated/exemplary voltage levels to implement the read and write operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt, (or more)) whether one or more of the voltages (for example, the source, drain or gate voltages) become or are positive and negative.

Moreover, the above embodiments of the inventions are merely exemplary. They are not intended to be exhaustive or to limit the inventions to the precise forms, techniques, materials and/or configurations disclosed. Many modifications and variations are possible in light of this disclosure, it is to be understood that other embodiments may be utilized and operational changes may be made without departing from the scope of the present inventions. As such, the scope of the inventions is not limited solely to the description above because the description of the above embodiments has been presented for the purposes of illustration and description.

It should be noted that the term "circuit" may mean, among other things, a single component or a multiplicity of components (whether in integrated circuit form or otherwise), which are active and/or passive, and which are coupled together to provide or perform a desired operation. The term "circuitry" may mean, among other things, a circuit (whether integrated or otherwise), or a group of circuits (whether integrated or otherwise).

The term "inhibit" may mean, among other things, prevent, thwart, inhibit and/or disable. The phrase "to sense" or similar, means, for example, to measure, to sample, to sense, to inspect, to detect, to monitor and/or to capture.

What is claimed is:

1. A method for biasing an integrated circuit device comprising:

applying a plurality of voltage potentials using at least one of write circuitry and read circuitry to at least one first memory cell including a first transistor of a plurality of memory cells arranged in a matrix of rows and columns, wherein applying a plurality of voltage potentials to the at least one first memory cell comprises:

applying a first voltage potential to a source region of the first transistor via a source line;

applying a second voltage potential to a drain region of the first transistor via a bit line;

applying a third voltage potential to a body region of the first transistor via a word line coupled to a gate disposed over the body region, wherein the body region is electrically floating and programmable to store one of a plurality of data states which are representative of an amount of charge stored in the body region.

2. The method of claim 1, further comprising applying a plurality of de-select voltage potentials using at least one of the write circuitry and the read circuitry to at least one second memory cell including a second transistor of the plurality of memory cells.

3. The method of claim 2, wherein applying a plurality of de-select voltage potentials comprises increasing a voltage potential applied to a drain region of the second transistor from the voltage potential applied to the drain region of the second transistor during a hold operation to inhibit at least one of a write operation and a read operation.

4. The method of claim 2, wherein applying a plurality of de-select voltage potential comprises applying a constant voltage potential to the drain region of the second transistor, wherein the constant voltage potential is higher than a voltage potential applied to the drain region of the second transistor during a hold operation.

5. The method of claim 1, further comprising increasing the first voltage potential applied to the source line from the first voltage potential applied to the source line during a hold operation to perform at least one of a write logic low operation, a write logic high operation, and a read operation.

6. The method of claim 5, further comprising increasing the third voltage potential applied to the word line from the third voltage potential applied to the word line during the hold operation to perform at least one of the write logic low operation, the write logic high operation, and the read operation.

7. The method of claim 6, further comprising increasing the second voltage potential applied to the bit line from the second voltage potential applied to the bit line during the hold operation to perform the write logic low operation.

8. The method of claim 7, wherein the second voltage potential applied to the bit line is increased before increasing the first voltage potential applied to the source line.

9. The method of claim 8, wherein the second voltage potential applied to the bit line is equal to the third voltage potential applied to the word line during the write logic low operation.

10. The method of claim 6, further comprising maintaining the second voltage potential applied to the bit line at the second voltage potential applied to the bit line during the hold operation to perform the write logic high operation.

11. The method of claim 10, wherein the third voltage potential applied to the word line is higher than the second voltage potential applied to the bit line during the write logic high operation.

12. The method of claim 6, further comprising maintaining the second voltage potential applied to the bit line at the second voltage potential applied to the bit line during the hold operation to perform the read operation.

13. The method of claim 12, wherein the third voltage potential applied to the word line is lower than the second voltage potential applied to the bit line during the read operation.

14. The method of claim 1, further comprising decreasing the first voltage potential applied to the source line from the first voltage potential applied to the source line during a hold operation to perform at least one of a write logic low operation, a write logic high operation, and a read operation.

15. The method of claim 14, further comprising increasing the third voltage potential applied to the word line from the third voltage potential applied to the word line during the hold operation to perform at least one of the write logic low operation, the write logic high operation, and the read operation.

16. The method of claim 15, further comprising decreasing the second voltage potential applied to the bit line from the second voltage potential applied to the bit line during the hold operation to perform the write logic low operation.

17. The method of claim 16, wherein the second voltage potential is equal to the third voltage potential during the write logic low operation.

18. The method of claim 15, further comprising maintaining the second voltage potential applied to the bit line at the second voltage potential applied to the bit line during the hold operation to perform at least one of the write logic low operation and the read operation.

19. The method of claim 18, wherein the third voltage potential applied to the word line is lower than the second voltage potential applied to the bit line during the write logic high operation.

20. The method of claim 18, wherein the third voltage potential applied to the word line is higher than the second voltage potential applied to the bit line during the read operation.

* * * * *